(12) United States Patent
Huttula et al.

(10) Patent No.: US 12,439,572 B2
(45) Date of Patent: Oct. 7, 2025

(54) THERMAL SOLUTION AS AN EFFECTIVE EMI SHIELD

(71) Applicant: Intel Corporation, Santa Clara, CA (US)

(72) Inventors: Justin Huttula, Portland, OR (US); Bala Subramanya, Bangalore (IN); Juha Paavola, Hillsboro, OR (US); Mark Carbone, Cupertino, CA (US); Todd Smith, Hillsboro, OR (US); Kari Mansukoski, Hillsboro, OR (US); Samarth Alva, Bangalore (IN); Satyajit Siddharay Kamat, Bangalore (IN); Nagaraj K, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 1079 days.

(21) Appl. No.: 17/186,092

(22) Filed: Feb. 26, 2021

(65) Prior Publication Data

US 2021/0235603 A1 Jul. 29, 2021

(51) Int. Cl.
*H05K 9/00* (2006.01)
*H05K 7/20* (2006.01)

(52) U.S. Cl.
CPC ....... *H05K 9/0081* (2013.01); *H05K 7/20336* (2013.01)

(58) Field of Classification Search
CPC .................................................. H05K 9/0081
See application file for complete search history.

(56) References Cited

U.S. PATENT DOCUMENTS 10,622,279 B1 * 4/2020 Minawati ............. H01L 23/427
2023/0337406 A1 * 10/2023 Bawa ................... H05K 7/2099

FOREIGN PATENT DOCUMENTS

WO WO-2019241035 A1 * 12/2019

* cited by examiner

*Primary Examiner* — Hung V Ngo
(74) *Attorney, Agent, or Firm* — 2SPL Patent Attorneys PartG mbB; Kieran O'Leary

(57) ABSTRACT

A circuit board and vapor chamber are disclosed. Connectors couple the vapor chamber to a circuit board. The connectors extend from the bottom of the vapor chamber. The connectors fix the vapor chamber to the circuit board such that the bottom of the vapor chamber thermally couples to a heat source on the circuit board. The circuit board has a connector assembly that couples to the vapor chamber.

11 Claims, 26 Drawing Sheets

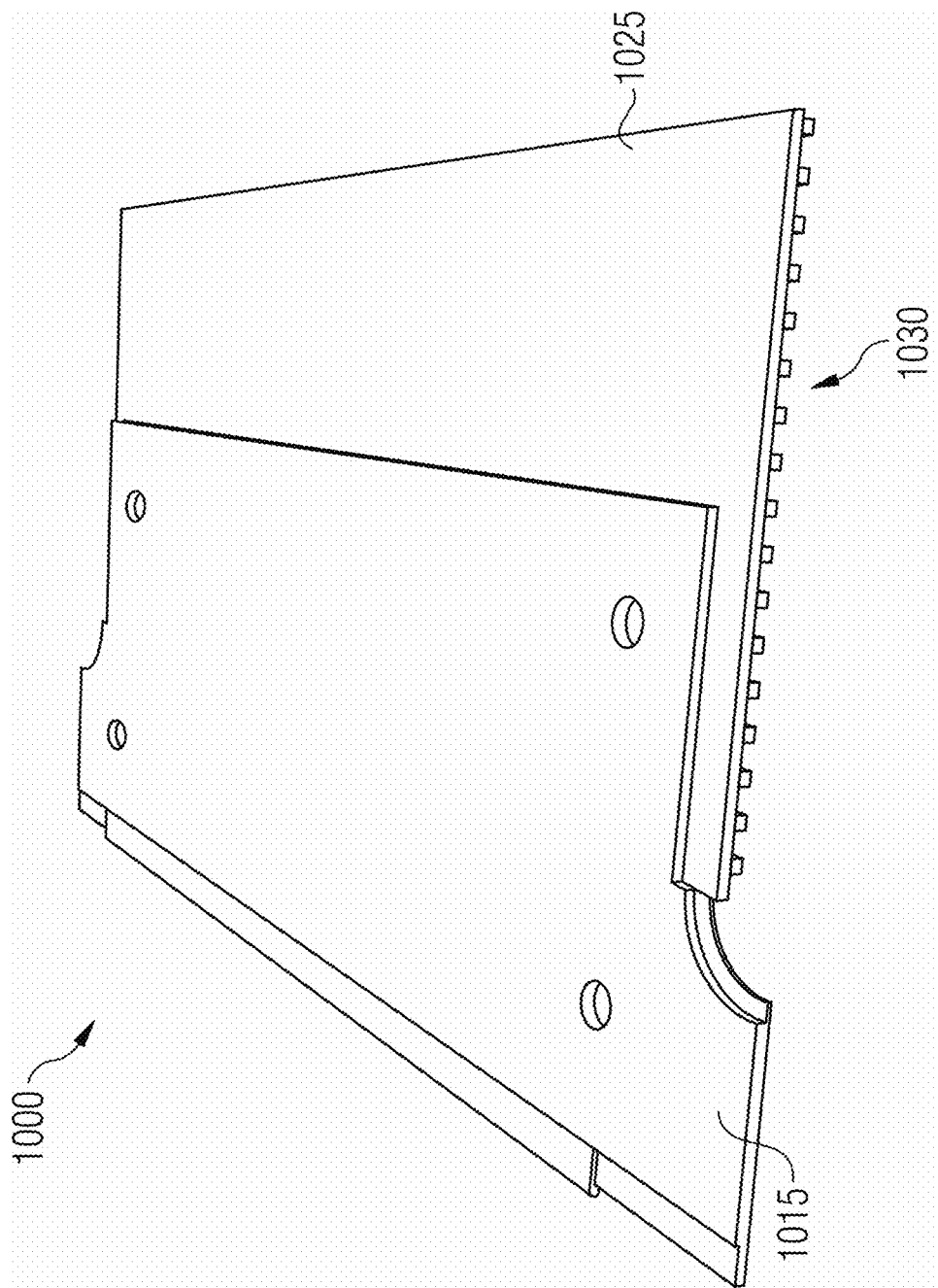

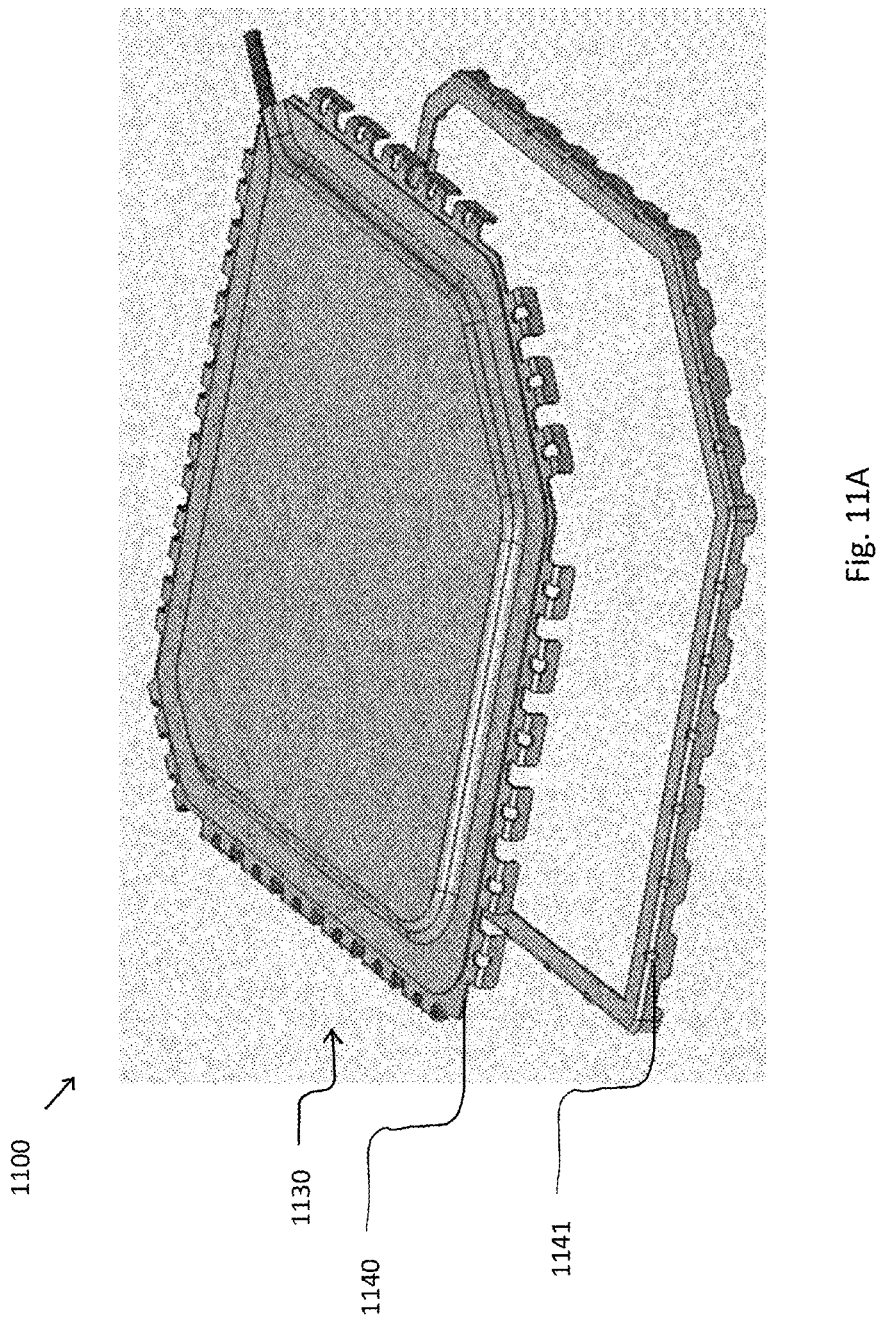

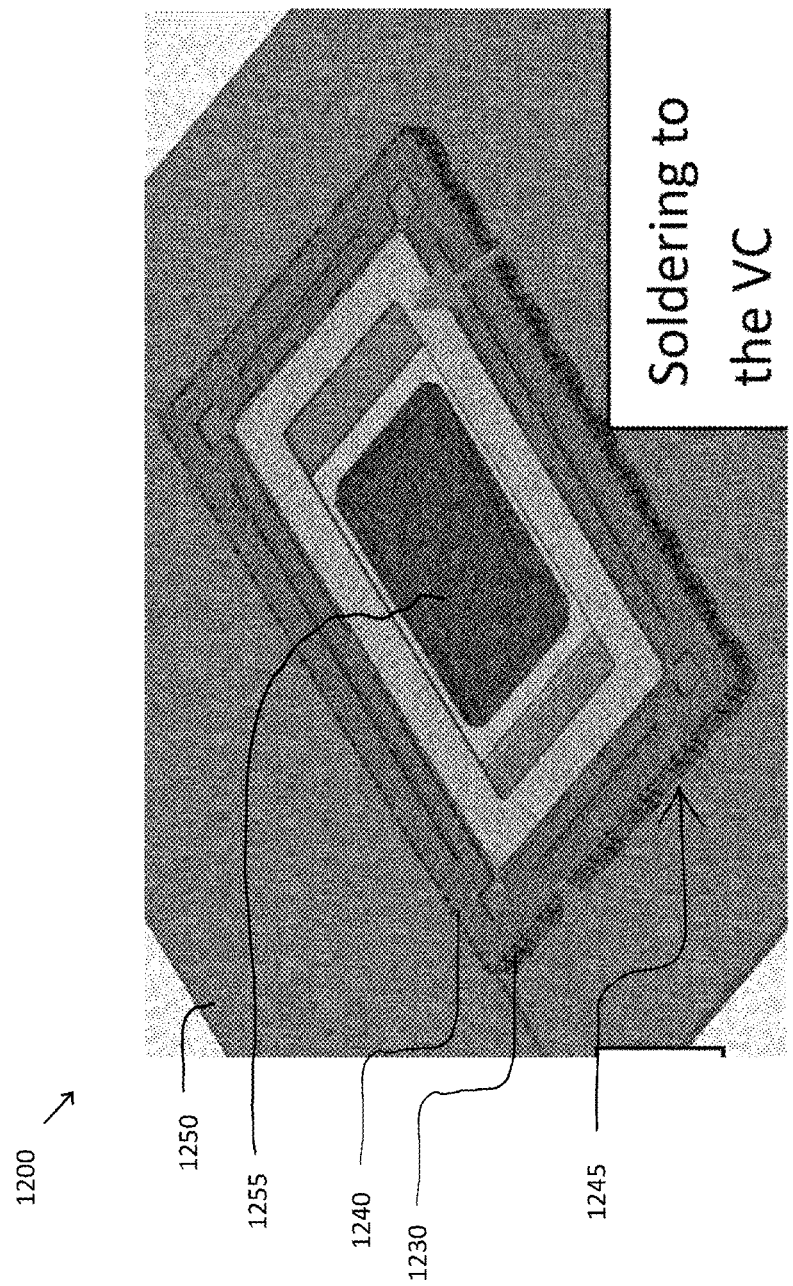

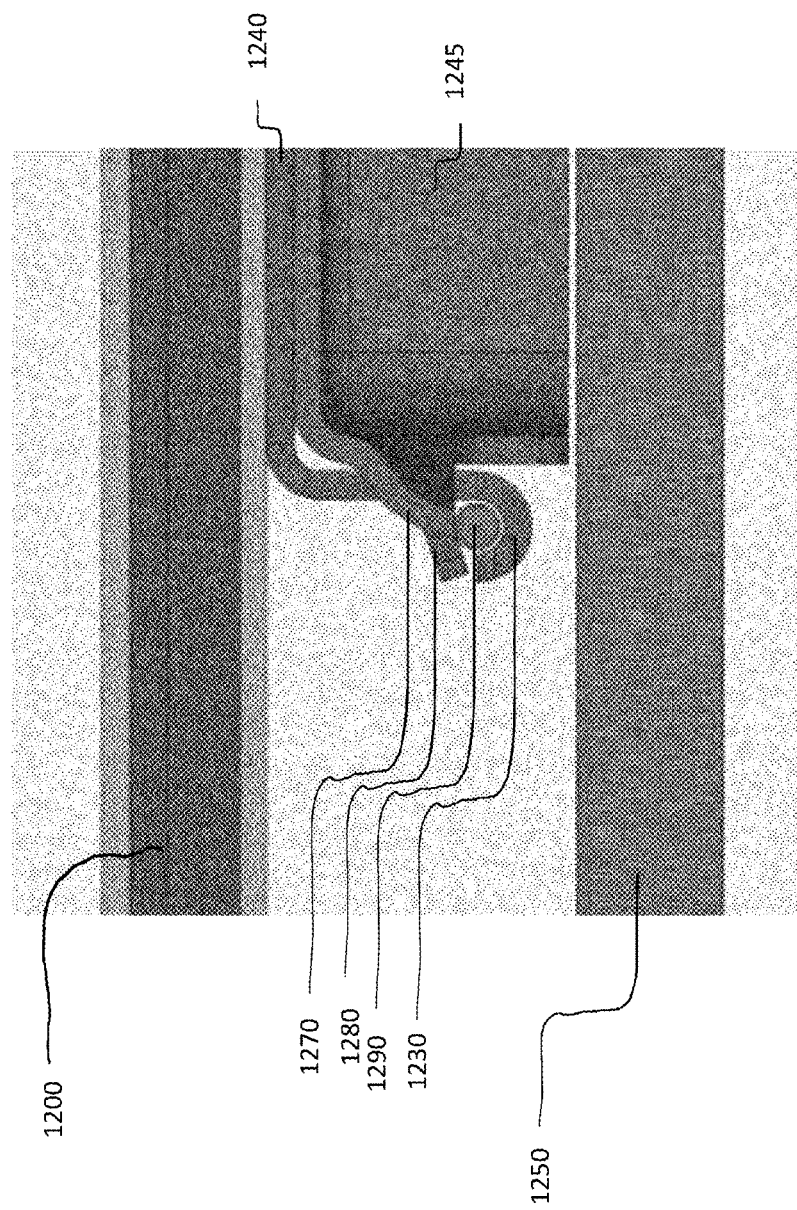

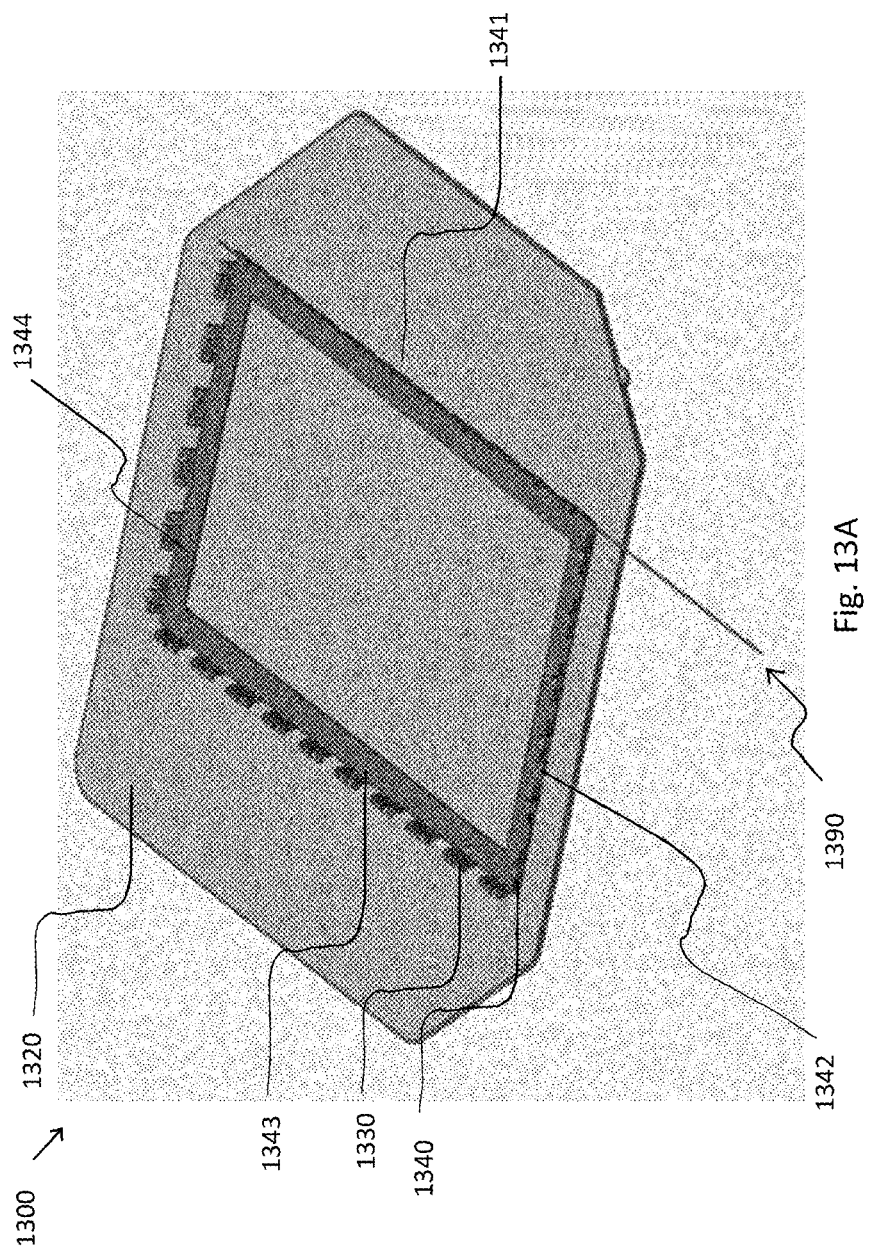

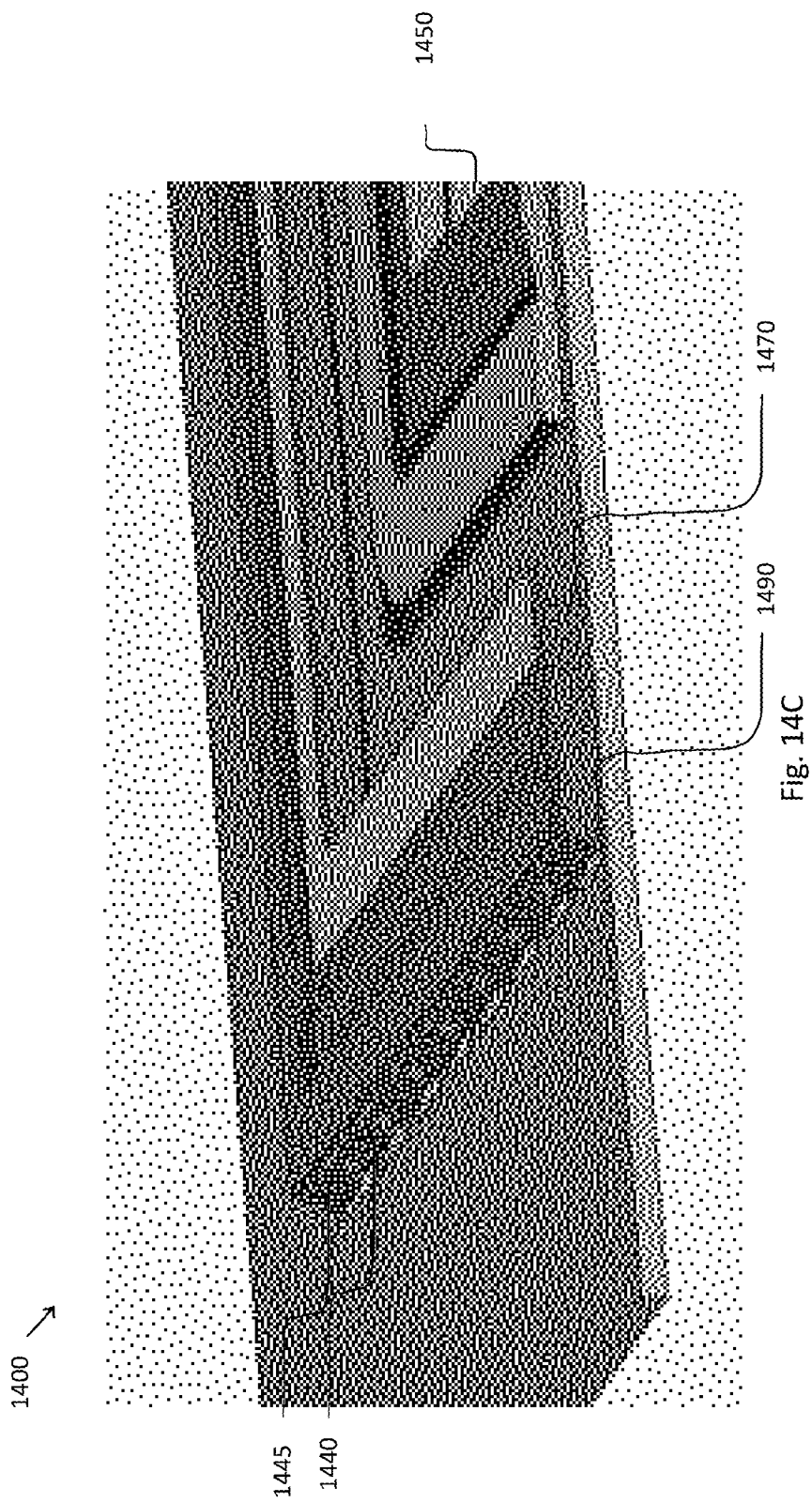

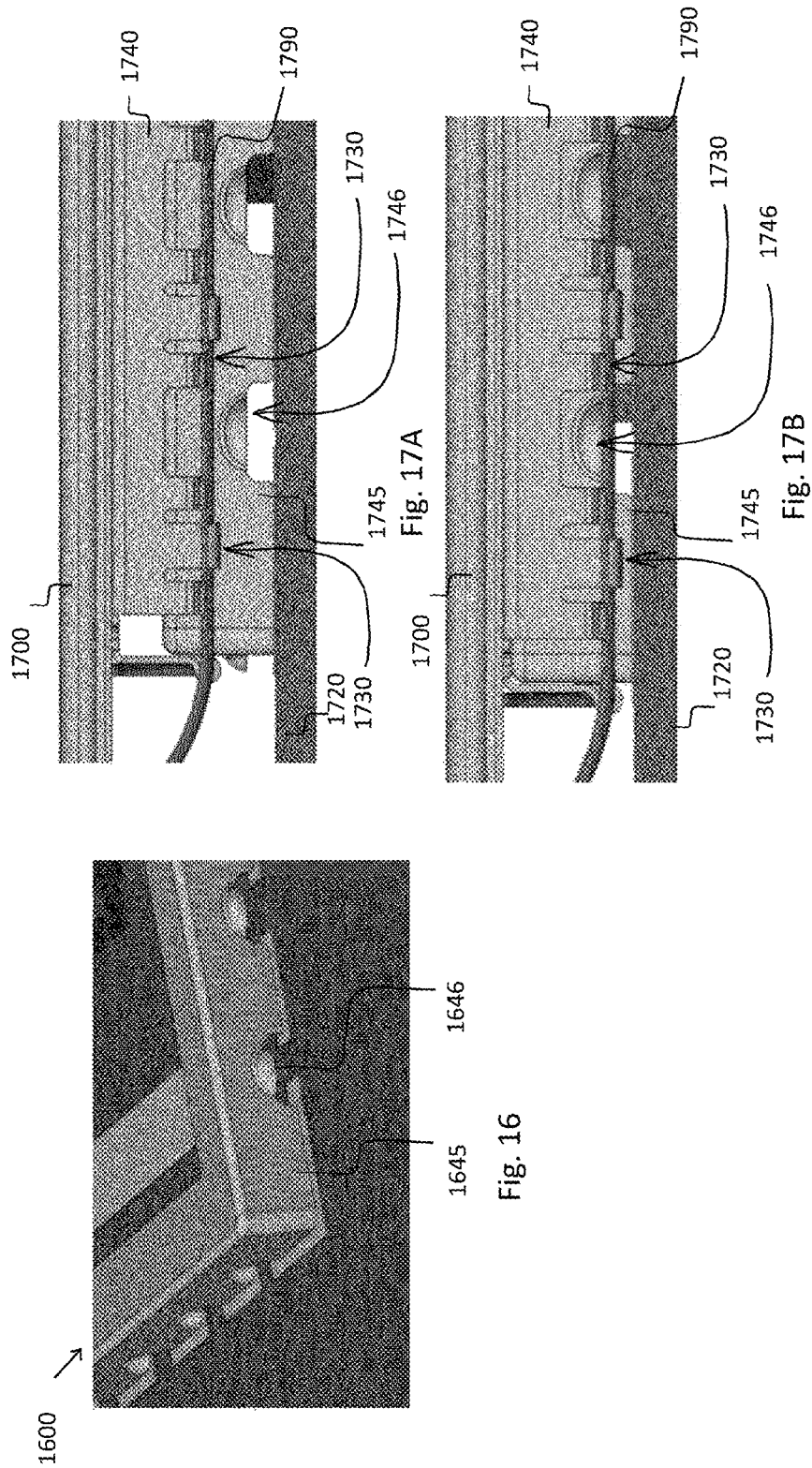

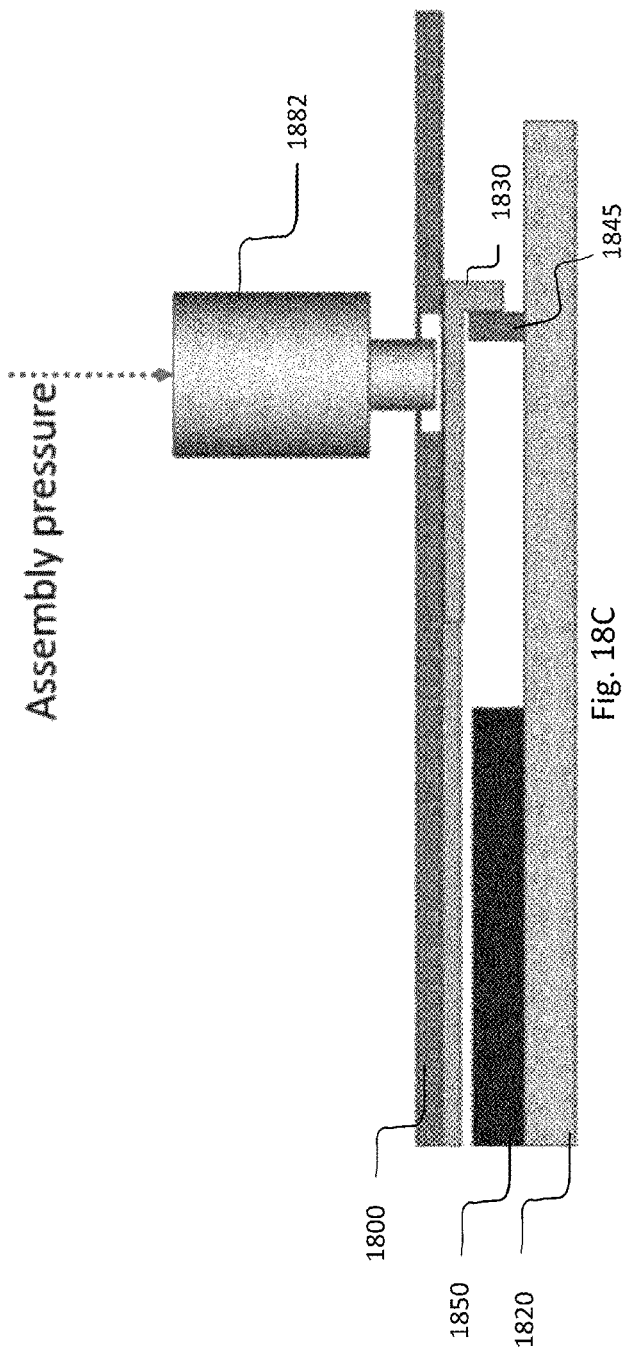

THERMAL SOLUTION AS AN EFFECTIVE EMI SHIELD

FIELD

Examples relate to cooling concepts and/or electromagnetic shielding for electronic devices.

BACKGROUND

Modern electronic devices, especially those with very small feature sizes, may draw substantial power and generate large amounts of heat. Because heat accumulation can damage electronic components, heat dissipation is an important concern in system design.

Components of electronic devices may also generate or be sensitive to electromagnetic waves. Shielding of components from electromagnetic interference, EMI, is also a concern.

Electronic devices are also increasingly expected to be small, such as to have a relatively thin profile. It is desirable to meet expected performance while having a small and/or thin shape. With increasing performance and/or function of devices, and smaller size, challenges may arise in dealing with heat and electromagnetic interference.

BRIEF DESCRIPTION OF THE FIGURES

Some examples of apparatuses and/or methods will be described in the following by way of example only, and with reference to the accompanying figures, in which
FIG. 10A illustrates a vapor chamber;
FIGS. 11A and 11B illustrate an electronic device;
FIGS. 12A and 12B illustrate an electronic device;
FIGS. 13A and 13B illustrate a vapor chamber;
FIGS. 14A, 14B, and 14C illustrate a circuit board;
FIG. 16 shows a circuit board;
FIG. 17A shows a vapor chamber and circuit board;
FIG. 17B shows a vapor chamber and circuit board;
FIGS. 18A, 18B, and 18C show assembly of an electronic device.

DETAILED DESCRIPTION

Figure 1:
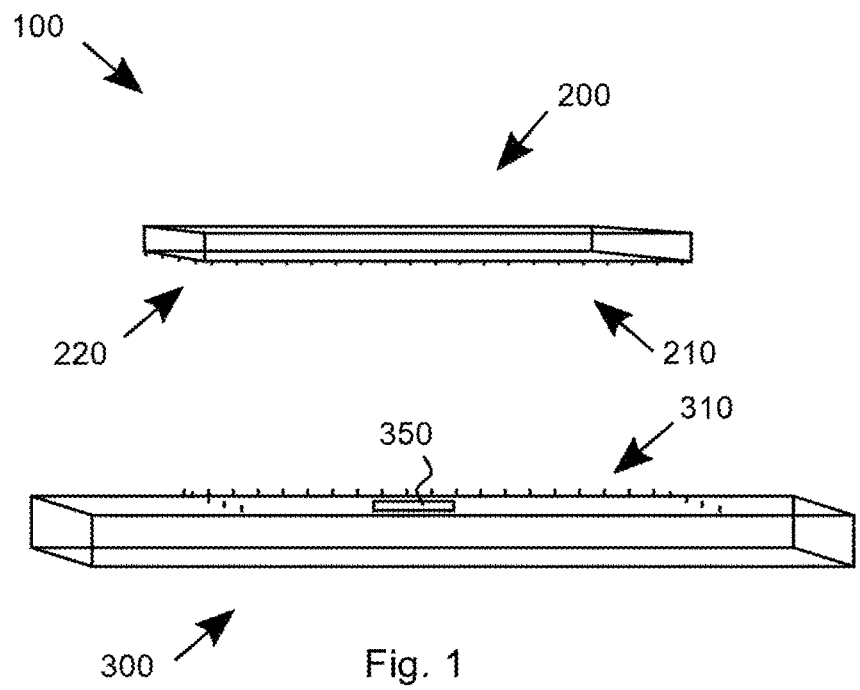
FIG. 1 illustrates an electronic device.

Some examples are now described in more detail with reference to the enclosed figures. However, other possible examples are not limited to the features of these examples described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 shows a schematic illustration of an electronic device 100. The vapor chamber and/or circuit board of FIG. 1 can have the features and/or functionalities of the vapor chambers and/or circuit boards described herein. The electronic device 100 includes a vapor chamber 200 and circuit board 300. The circuit board 300 has a heat source 350. The heat source 350 can be at least one processor, such as a central processor and a graphics processor. The vapor chamber 200 includes a plurality of connectors 210 which can couple to the circuit board 300. The connectors 210 extend from a bottom 220 of the vapor chamber 200. The connectors can fix the vapor chamber 200 to the circuit board 300 such that the bottom 220 of the vapor chamber 200 thermally couples to the heat source 350 on the circuit board 300.

The heat source 350 can be attached to a region of the circuit board 300. The vapor chamber 200 can thermally couple to the heat source 350. A connector assembly 310 can couple the vapor chamber 200 to the heat source 350. The region on which the heat source 350 is attached can be spanned by the vapor chamber 200.

The vapor chamber 200 may electromagnetically shield the heat source 350. The vapor chamber 200 can include an electromagnetic shielding material, such as a conductive material, such as a metal. By combining shielding and cooling, space can be saved. Shielding is increasingly important for devices capable of wireless communication, including devices for 4G and/or 5G. For example, radio-frequency interference can occur between components, such as between CPUs, GPS, memory, and antennas. Small, thin, and/or light devices, for example bezel-less laptops may be achieved by space-saving measures.

The heat source 350 may couple to the vapor chamber 200 to distribute heat generated by the heat source 350 during operation of the electronic device 100. By coupling a vapor chamber 200 to a heat source 350 of an electronic device 100, heat generated by the heat source 350 may be dissipated quickly away from the heat source 350.

The vapor chamber 200 may be directly or indirectly thermally coupled to the heat source 350 through a thermal interface material TIM (e.g. thermal grease, heat-conducting paste or liquid metal). The TIM may improve the thermal contact between the vapor chamber 200 and the heat source 350. For example, a metal plate (e.g. cold plate or pedestal) may be arranged between the heat source 350 and the vapor chamber 200 or the vapor chamber 200 may be coupled to the heat source 350 through a thermal interface material. The metal plate may be a copper plate or an aluminum plate or a plate made of another suitable metal or alloy. For example, the vapor chamber 200 may be in contact with the heat source 350, optionally through the TIM between.

The thermal interface material may compensate unevennesses of the surface of the heat source 350 and/or the surface of the vapor chamber 200. Compensating the unevenness can enable efficient thermal contact over the surface of the heat source 350, e.g. such that heat is efficiently conducted away from the heat source 350. The thermal interface material may have maximum thickness of 0.25 mm (or 0.2 mm or 0.15 mm).

The heat source 350 may include an electronic component such as a semiconductor device that generates heat (e.g. waste heat) during operation. The waste heat may be generated automatically during operation of the electronic component. The electronic component may include an integrated circuit, such as a packaged IC. Alternatively/additionally, the electronic component can include a semiconductor die. The semiconductor die may be a bare die with uncovered backside or a packaged semiconductor die. The heat source 350 may have a package material (e.g. mold or another material). The heat source 350 may have a surface which may be opposite to the circuit board surface 300. The vapor chamber 200 may contact the surface of the heat source 350, such as through a metal plate as described above or through the TIM.

The heat source 350 may be at least one of a processor (e.g. a CPU, a microcontroller, a digital signal processor or a graphics processing unit GPU), a transmitter, a receiver, a transceiver, a field programmable gate array, an amplifier, a power supply, a voltage converter, and an integrated circuit.

The electronic device may be a tablet, a laptop, a notebook, a mobile phone, a computer (e.g. personal computer or server) or another electronic device.

The electronic device 100 may include components (e.g. a cold plate), structures (e.g. a guiding structure for air flow) and/or components (e.g. vapor chamber, heat pipe and/or fan), which can help to actively or passively distribute or dissipate heat generated by the heat source 350. Such components, for example, may contribute to a cooling system of the electronic device.

More details, optional features and aspects are mentioned in connection with the examples described below.

Figure 2:
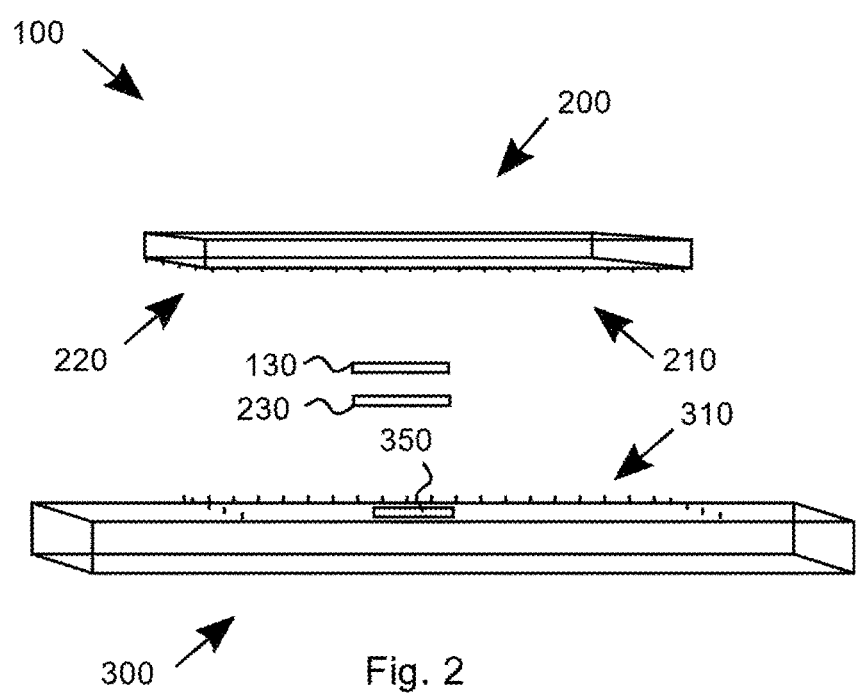
FIG. 2 shows an electronic device.

FIG. 2 shows a schematic illustration of an electronic device 100. The vapor chamber and/or circuit board of FIG. 2 can have the features and/or functionalities of the vapor chambers and/or circuit boards described herein. The electronic device 100 includes a vapor chamber 200 and circuit board 300. The circuit board 300 has a heat source 350. The vapor chamber 200 includes a plurality of connectors 210 which can couple to the circuit board 300. The connectors 210 extend from a bottom 220 of the vapor chamber 200. The connectors can fix the vapor chamber 200 to the circuit board 300 such that the bottom 220 of the vapor chamber 200 thermally couples to the heat source 350 on the circuit board 300.

A thermal interface material 130 can be between the vapor chamber 200 and the heat source 350. The heat source 350 and the vapor chamber 200 More details, optional features, and aspects are mentioned in connection with one or more examples described above or below.

Figure 3:
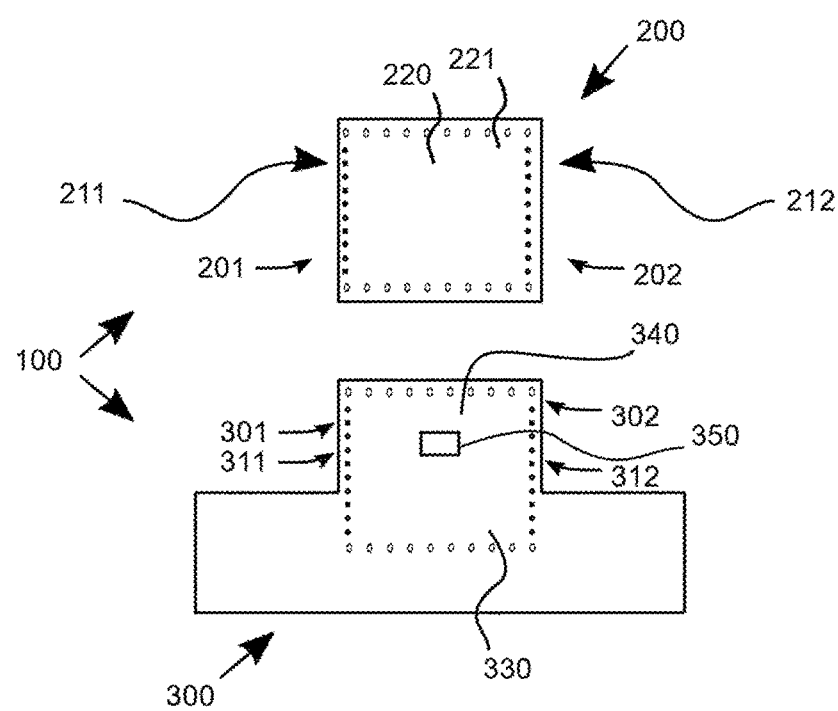
FIG. 3 shows an electronic device.

FIG. 3 shows a schematic illustration of an electronic device 100. The electronic device 100 may be implemented similarly as the electronic device 100 described in connection with FIGS. 1 and/or 2. The vapor chamber and/or circuit board of FIG. 3 can have the features and/or functionalities of the vapor chambers and/or circuit boards described herein. The heat source 350 can be mounted on the circuit board 200 (e.g. mother board).

The view of FIG. 3 shows the bottom 220 of the vapor chamber 200. The vapor chamber 200 can include a flat coupling surface 221, which may be at the bottom 220 of the vapor chamber 200. The flat coupling surface 221 may thermally couple to the heat source 350. For example, the vapor chamber has a flat bottom for making contact with a region of 120×80 mm for transferring heat therefrom.

The view of FIG. 3 shows a region 330 of the circuit board 300 on which the heat source 350 can be attached. The connector assembly 310 can include attachment elements 311, 312, such as a first row 311 of attachment elements and a second row 312 of attachment elements. The connector assembly 310 can possibly snap-fit to the vapor chamber. The region 330 for the heat source 350 can be between the first and second rows 311, 312. The circuit board 300 may have first and second edges 301, 302 which are opposite each other. The region 330 may be between the edges 301, 302. The first row 311 of the attachment elements can be at the first edge 301. The second row 312 of the attachment elements can be at the second edge 302.

The vapor chamber 200 can thermally couple to the heat source 350 on the circuit board 300 between the edge 301 and the opposite edge 302 of the circuit board 300.

The first and second rows 311, 312 of the attachment elements can be at opposite edges of the circuit board 300, e.g. at opposite edges of the middle leg 340. FIG. 3 shows a middle leg 340 of the circuit board 300. The middle leg 340 can include, at least partially, the first and second rows 311, 312 of the connector assembly 310. The first row 311 can be at an edge 301 of the middle leg 340. The second row 312 can be at the opposite edge 302. Such a geometry can allow the vapor chamber 400 to be fixed to the circuit board 430.

The vapor chamber 200 includes an edge 201 and an opposite edge 202. The edge 201 can be configured to be along a corresponding edge 301 of the circuit board 300. The opposite edge 202 of the vapor chamber 200 can be configured to be along a corresponding opposite edge 302 of the circuit board 300. The vapor chamber 200 can thermally couple to the heat source 350 on the circuit board 300 between the edge 301 of the circuit board and the opposite edge 302 of the circuit board 300.

By connecting the vapor chamber 200 at edges 301, 302 of the circuit board, space can be efficiently utilized. Attachment at the edges can reduce the area of the circuit board and/or vapor chamber that is used for assembly hardware, freeing up space for electronic components. Attachment at the edge may also allow for increased dimensional tolerances. Tooling and design costs can also be reduced, by using the edges for connection. The connectors described herein may also allow for repeated and/or reversible assembly and disassembly. Alternatively/additionally, the connectors described herein may have little impact on the Qmax of the vapor chamber.

The heat source 350 can be arranged between the vapor chamber 200 and the circuit board 300. The heat source 350 and the vapor chamber 200 may attach to the circuit board 300.

The heat source 350 can include a semiconductor die on a package substrate forming a semiconductor device (e.g. a CPU and/or GPU). The semiconductor device can be mounted to the circuit board 300 (e.g. a motherboard). Heat can be dissipated from the heat source 350 through the vapor chamber 200, such as to the environment. The semiconductor die (e.g. CPU and/or GPU) can be attached to a substrate (e.g. CPU substrate), which can be attached to a socket. The socket may be fixed to the circuit board 300. Interconnects can be between the semiconductor die and the substrate and/or between the substrate and the socket. The semiconductor die, the substrate, and the socket may form a semiconductor device mounted to the circuit board 300. The semiconductor device may be fixed to the circuit board through a connection structure (e.g. a load plate), which may engage at an edge of the substrate. The circuit board 300 can be connected to an enclosure of the electronic device. At least one fan may be located in proximity to the vapor chamber 200.

The heat source 350 may include a processor (e.g. CPU, microcontroller, digital signal processor or a graphics processing unit GPU), a transmitter, a receiver, a transceiver, a power supply and/or a voltage converter or another integrated circuit.

The electronic device 100 may be a tablet, a laptop, a notebook, a mobile phone, a computer (e.g. personal computer or server) or another electronic device.

The electronic device 100 may comprise a thermal design power of at least 5 W, and up to 150 W, for example.

The electronic device 100 may have an enclosure with at least one vent. Optional fans may pass air through vents, particularly so as to cool the vapor chamber, directly or indirectly.

Figure 4:
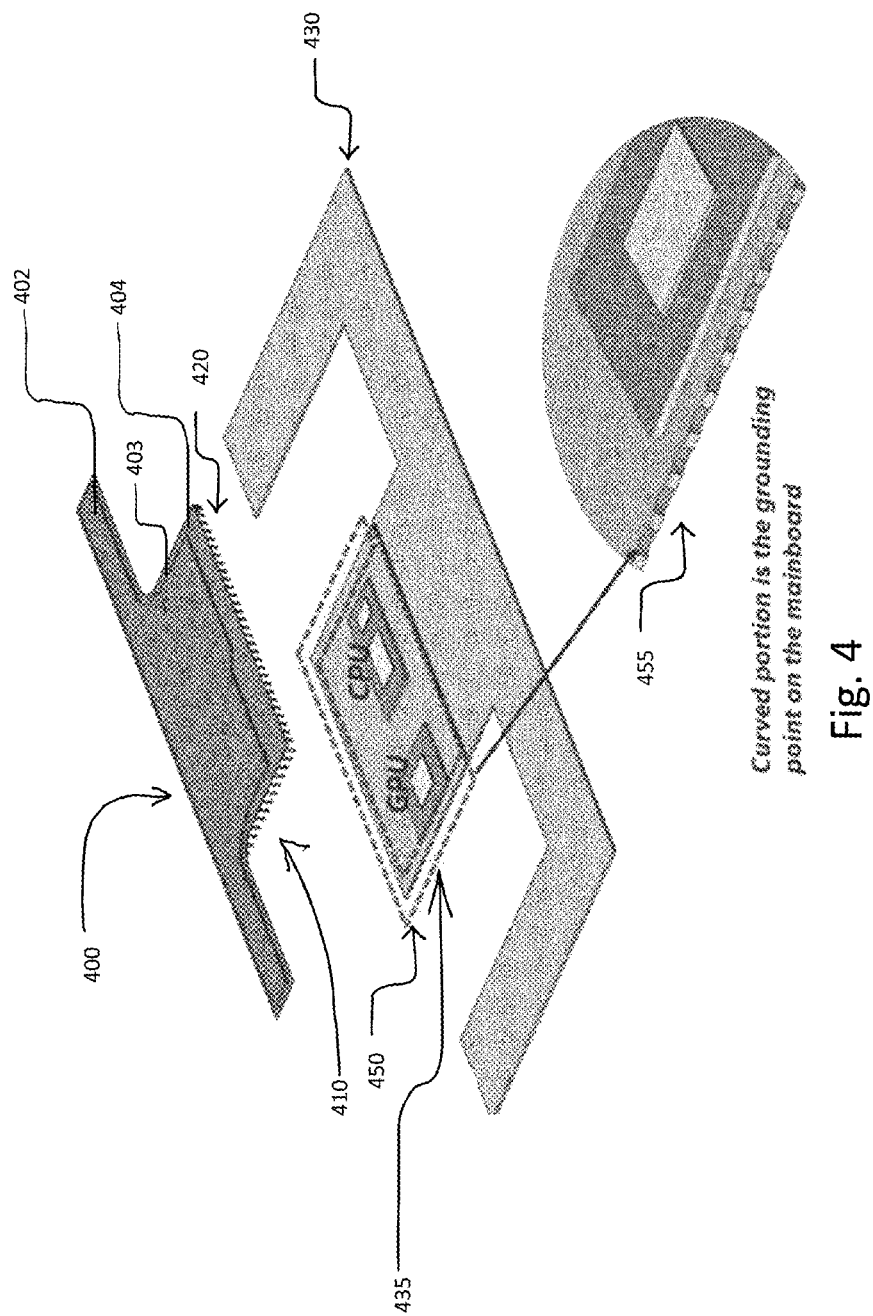
FIG. 4 shows a vapor chamber and circuit board.

A fan may allow efficient cooling, such as for thin and light devices. Space saving and optimization for other components or feature assemble in a system may be enabled by the examples described herein. Thin and light systems may be achievable. Costs may be reduced. Alternatively/additionally, weight can be reduced. For example, the weight of the electronic device e.g. a tablet, laptop can be at most 900 g (or at most 880 g or at most 850 g). For example, a heat sink and heat pipe may be eliminated to reduce size and/or weight. FIG. 4 illustrates a vapor chamber 400 and circuit board 430. The vapor chamber 400 and/or circuit board 430 of FIG. 4 can have the features and/or functionalities of the vapor chambers and/or circuit boards described herein.

The vapor chamber includes a plurality of connectors 410 that couple to the circuit board 430. The connectors 410 extend from a bottom of the vapor chamber 400, and fix the vapor chamber 400 to the circuit board 430 such that the bottom of the vapor chamber 400 thermally couples to a heat source, such as a graphics processing unit and/or central processing unit (GPU and/or CPU), on the circuit board 430. The circuit board 430 includes a region for attachment of the heat source 435, a connector assembly 440 to couple to vapor chamber 400, such that the vapor chamber 400 thermally couples to the heat source 435.

The connectors 410 can couple at edges of the circuit board 430.

The vapor chamber 400 can have a bottom plate 402 and a top plate 404. The top and bottom plates 402, 404 can be spaced apart, such as with at least one spacer 403. A chamber can be formed between the top and bottom plates 402, 404.

The at least one spacer 403 can span the chamber between the inside of the bottom plate and the inside of the top plate. The insides of the top and bottom plates 402, 404 can be at the interior of the chamber. The spacer(s) 403 can include pillars, which may allow for a gap between the plates, 402, 404, such as to allow for the chamber. There can be a gap between the inside of the top plate 402 and the inside of the bottom plate 404.

The outside of the bottom plate 404 of the vapor chamber 400 can couple to the heat source 435. The connectors 410 of the vapor chamber 400 may extend from the bottom plate 404.

The vapor chamber 400 can be T-shaped. For example, at least the bottom plate 404, and optionally the top plate 402, of the chamber 400 has a T-shape. The connectors 410 may extend from the stem of the T-shape. The stem of the T can connect to the circuit board, 430. The connectors 410 can be at the opposite edges of the stem of the T-shape, and may also be at the bottom of the stem of the T-shape.

The edges of the stem of the T-shape of the chamber 400 can connect at corresponding edges of the circuit board 430.

FIG. 4 shows a magnified inset which shows a connector assembly 450. The connector assembly 450 may include castellations 455 as shown. The connector assembly 450 of the circuit board 430 can include attachment elements 455 of at least one type, such as receiving members, castellations, recesses (particularly in the edge of the circuit board 430), and holes. Castellations, recesses, and holes can be formed in the circuit board 430. FIG. 4 illustrates attachment elements 455 in the form of castellations. Alternatively/additionally, holes in the circuit board may also be attachment elements 455.

Castellations may be produced at low cost, and/or may be straightforward to align with the connectors 410 of the vapor chamber 400. Attachment elements 455, particularly castellations, may be at edges of the circuit board.

The connector assembly 450 can make contract forces with the vapor chamber 400 in the plane of the circuit board 430. For example, when castellations, recesses, or holes are used as the attachment elements 455, the connectors 410 of the vapor chamber 400 may make contact with the circuit board 430 at edges of the circuit board 430. Alternatively/additionally, the connector assembly may make negligible contact forces in a direction perpendicular to the plane of the circuit board. It may be desirable to have negligible contact forces perpendicular to the plane of the board to allow precise control of the vertical forces by other means. For example, a leaf spring may apply a force to ensure contact between the vapor chamber and the heat source. The leaf spring may provide the force at strategic positions such as at positions which correspond to the positions of heat sources on the circuit board. By having an attachment that does not impact the vertical pressure on the heat source, the bond line thickness of the thermal interface material may be better controlled (e.g. the thermal interface material between the heat source and the vapor chamber).

Alternatively/additionally, utilizing negligible contact forces perpendicular to the plane of the board may allow for reversible assembly/disassembly of the electronic device, e.g. reversible assembly of the vapor chamber to the circuit board. Using a leaf-spring and/or using connectors that have negligible contact forces perpendicular to the plane of the board can allow for more precise control over the bond line thickness (BLT) of a thermal interface material (TIM), such as a thermally conductive paste between the heat source and the vapor chamber. Precise control of the TIM thickness, for example, can allow for efficient cooling by allowing for the TIM to fill in microscopic cracks in surfaces and provide an efficient thermally conducting path from heat source to vapor chamber.

The connectors 410 and/or attachment elements 455 described herein can loosen manufacturing tolerances such that greater quality throughput can be achieved in manufacturing.

Attachment elements 455 may include a conductor which can electrically contact the connectors 410 of the vapor chamber 400. The conductor of the attachment elements 455 may be in electrical communication with the ground plane (e.g. of the circuit board). Alternatively/additionally, a ground plane, such as that of the circuit board, may make electrical contact with the vapor chamber 400 through the connector assembly 450. The connectors 410 can electrically connect the electromagnetic shielding material of the vapor chamber 400 to a ground of the circuit board 430, such as a ground plane of the circuit board 430. Using attachment elements 455 that include a conductor can aid in electromagnetically shielding the circuit board from the environment. Alternatively/additionally, using connectors 410 of the vapor chamber 400 that include a conductor can aid in electromagnetically shielding the circuit board from the environment. The vapor chamber 400 can contact ground structures on the edges (e.g. lateral surfaces) of the circuit board; such contact can be direct electrical contact.

The attachment elements 455 of the circuit board 340 may attach to the connectors 410 of the vapor chamber 400, such as by snap-fit.

Figure 5:
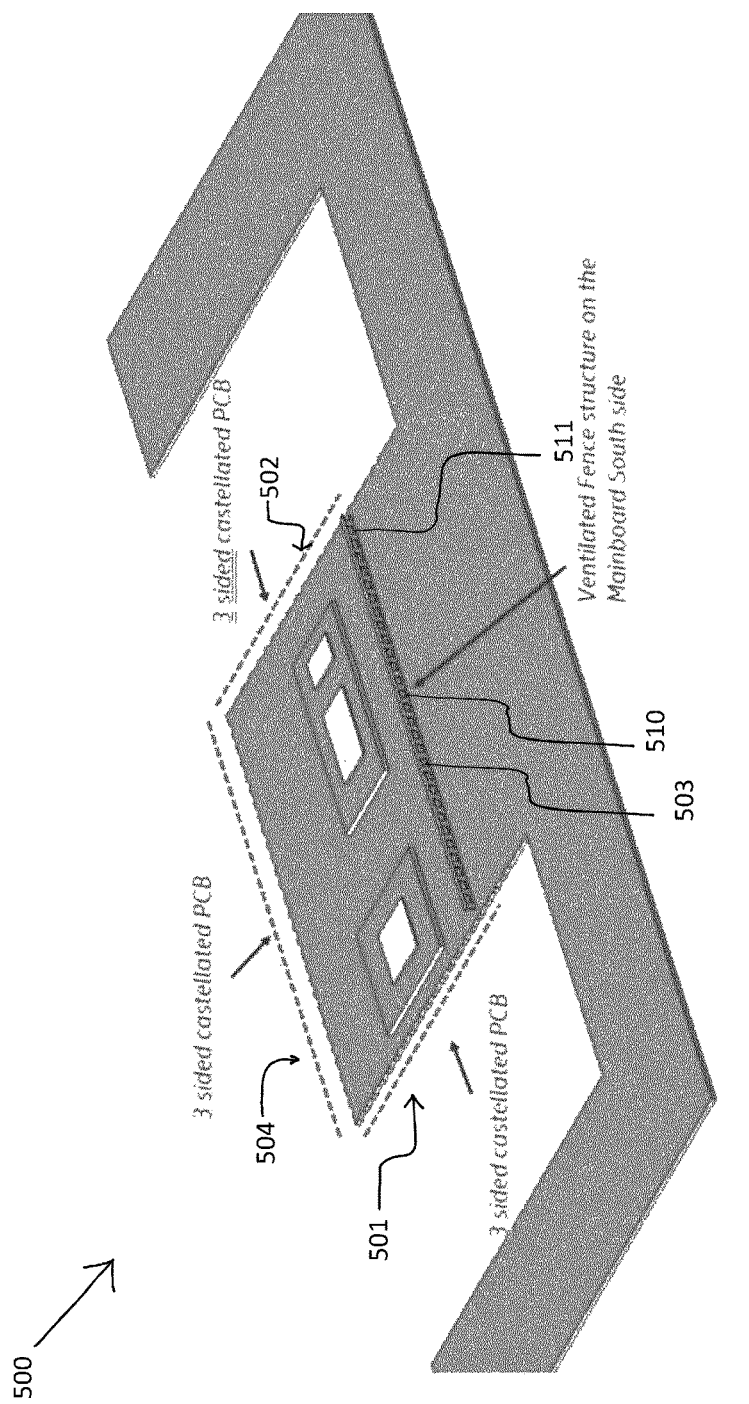
FIG. 5 shows a circuit board.

FIG. 5 illustrates a circuit board 500. The circuit board 500 of FIG. 5 can be used in combination with the vapor chambers described herein. The circuit board 500 may include features and/or components of other circuit boards described herein. The circuit board 500 has a region for attachment of a heat source, and a connector assembly to couple to a vapor chamber such that the vapor chamber thermally couples to the heat source. The circuit board 500 may have rows of connectors and/or attachment elements. The circuit board can have a first row 501, second row 502, an optional third row 503, and an optional fourth row 504 of attachment elements. The first row 501 and second row 502 may be opposite to each other. The third row 503 can be along a line from the first row 501 to the second row 502. The connector assembly can include a fence structure 510, such as a fence structure with vents 511. In the example of FIG. 5, the third row 503 includes a fence structure 510 on the circuit board 500. A fence may include vents 511 which may lead to the heat source.

The circuit board 500 of FIG. 5 uses exactly one fence structure 510. The circuit boards described herein can have a reduced number of fence structures, compared to known circuit boards which utilize vapor chambers, which can save space on the circuit board 500. Alternatively/additionally, the use at least one edge of the circuit board for connecting to the vapor chamber save space. The use of at least two edges and the use of three edges of the circuit board for connection to the vapor chamber is particularly contemplated herein, e.g. to save space on the circuit board.

FIG. 5 illustrates a circuit board 500 which includes a third row 503 which is south of the region for attachment of the heat source. South, in the example of FIG. 5, is toward the lower right of the figure. At the northern edge (toward the upper left), there can be an upper row 504 of connectors, e.g. a fourth row. The first through fourth rows 501, 502, 503, 504 may surround the region for attachment of the heat source. The first and second rows 501, 502 can connect, respectively, to opposite edges of the vapor chamber. Each row 501, 502, 503, 504 of connectors can have at least 4 connectors.

Castellations can be used as attachment elements and/or parts of the connector assembly. FIG. 5 shows a circuit board 500 which utilizes castellations. Alternatively/additionally, recesses at an edge of the circuit board 500 can be used. The fence 510 may form part of connector assembly which can enable more efficient cooling of the heat source, such as by allowing air to pass between the vapor chamber and the circuit board. In another alternative, the circuit board 500 can have holes which act as attachment elements, such as holes where the fence 510 is shown, e.g. connecting an end of the first row 501 to an end of the second row 502.

Figure 6:
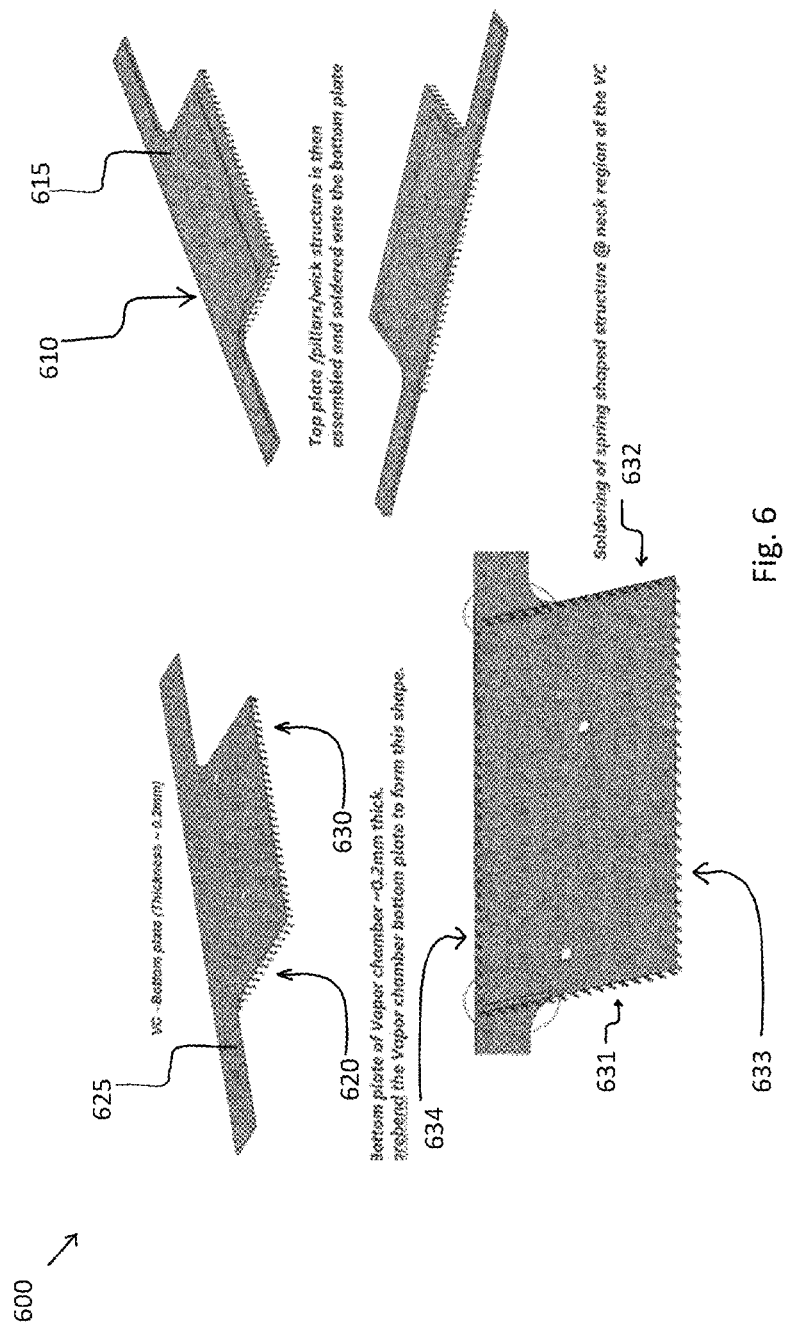
FIG. 6 illustrate assembly of a vapor chamber.

FIG. 6 illustrates assembly of a vapor chamber 600. The vapor chamber 600 of FIG. 6 can be used in combination with the circuit boards described herein. The vapor chamber 600 may include features and/or components of other vapor chambers described herein. The vapor chamber 600 includes a plurality of connectors 630 which can couple to a circuit board. The connectors 610 extend from a bottom 620 of the vapor chamber 600. The connectors 630 can fix the vapor chamber 600 to the circuit board such that the bottom 620 of the vapor chamber 600 thermally couples to the heat source on the circuit board.

The vapor chamber 600 can include a bottom plate 625. The connectors 630 can extend from the bottom of the bottom plate 625. The connectors 630 can be attached, such as integrally formed and/or soldered, to the bottom of the vapor chamber 600, such as the bottom plate 625. Alternatively, the connectors 630 can be welded, brazed, or attached by pressure sensitive adhesive.

The vapor chamber 600 can include a top plate 615. The top plate 615 can be attached to the bottom plate 625, such as by soldering. Alternatively, the attachment can be via welding, brazing, or by pressure sensitive adhesive. The top plate 615 can be spaced from the bottom plate 625 such that a chamber is between the top and bottom plates, 615, 625. A fluid may be within the chamber. A wick structure and spacers, such as pillars, may be included in the assembly of the top and bottom plates 615, 625. The wick structure may be used to influence the condensation and/or flow of a fluid inside the chamber. The chamber walls may include the top and bottom plates 615, 625. The bottom plate 625 and/or top plate 615 can have a thickness of at least 0.1 mm, 0.2 mm, 0.3 mm, 0.4 mm, 0.5 mm, or 0.6 mm thick, and up to 0.8 mm, 1.0 mm, 1.2 mm, or 1.5 mm thick.

The connectors 630 can alternatively/additionally be attached to a neck region of the vapor chamber 600. The connectors 630 of the neck region can be attached (soldered, welded, brazed, and/or attached by pressure sensitive adhesive for example) to the vapor chamber, such as the bottom 620 thereof, such as the bottom plate 625. The connectors can include spring shaped connectors and/or hook-shaped connectors, for example. The connectors 630 can include vertical spring contacts, e.g. be vertically oriented. For example, the connectors 630 are cantilever springs.

The connectors 630 can include rows of connectors, as shown in FIG. 6. There can be a first row 631 and second row 632, which can be opposite to each other. The connectors 630 can include a third row 633, which can be along a line from an end of the first row 631 to an end of the second row 632. The third row 633 can connect ends of the first and second rows 631, 632, as depicted in FIG. 6.

The connectors can include spring structures and/or spring-shaped structures, for example. The connectors 630 can flex, for example. The connectors 630 may include cantilever springs. The connectors 630 can include cantilevers, such as cantilevers attached at one end to the bottom 620 of the vapor chamber 600. The cantilevers can have a free end, which can be configured to attach to the circuit board. The free ends of the cantilevers can flex in a direction in the plane of the circuit board. For example, the connectors 630 include elastic cantilevers. Elastic cantilevers can optionally make a snap-fit joint, such as with the circuit board. Alternatively/additionally, the elastic cantilevers can make negligible contact forces in a direction perpendicular to the plane of the circuit board. The connectors 630 may make contact forces in directions in the plane of the circuit board, such as when the vapor chamber 600 is attached to a circuit board. Connectors 630 can make direct contact with edges of the circuit board, such as in order to have a reliable electrical contact between the vapor chamber 600 and the circuit board.

The connectors 630 can couple to edges, castellations, and/or holes of the circuit board. The connectors 630 can flex in a direction in the plane of the circuit board, such as to make contact forces in the plane of the circuit board. For, example the free ends of the connectors 630 can flex and make a contact force with the circuit board in the plane of the circuit board. For example, the first row 631 may make a contact force in a direction toward the second row 632. The free ends of the connectors 630 of the first row 631 can make a contact force with the circuit board in a direction toward the free ends of the connectors of the second row 632.

It is possible that the first row 631 of connectors is at an edge of the stem of a T-shaped vapor chamber 600 and the second row 632 is at an opposite edge 632 of the stem of the T-shaped vapor chamber 600. The first and second rows 631, 632 can attach to respective opposite edges of the circuit board.

A third row 633 can be at the southern edge of the stem of the T-shaped vapor chamber 600. The third row 633 optionally connects (e.g. attaches) to a fence on the circuit board. The fence can be ventilated. An upper row 634 of connectors 630 can be at the northern edge of the crossbar of the T-shaped vapor chamber 600. The upper row can connect an end of the first row 631 with an end of the second row 632 (e.g. the upper row extends from and end of the first row 631 to an end of the second row 632). The connectors 630 can secure the vapor chamber 600 to a circuit board.

Figure 7:
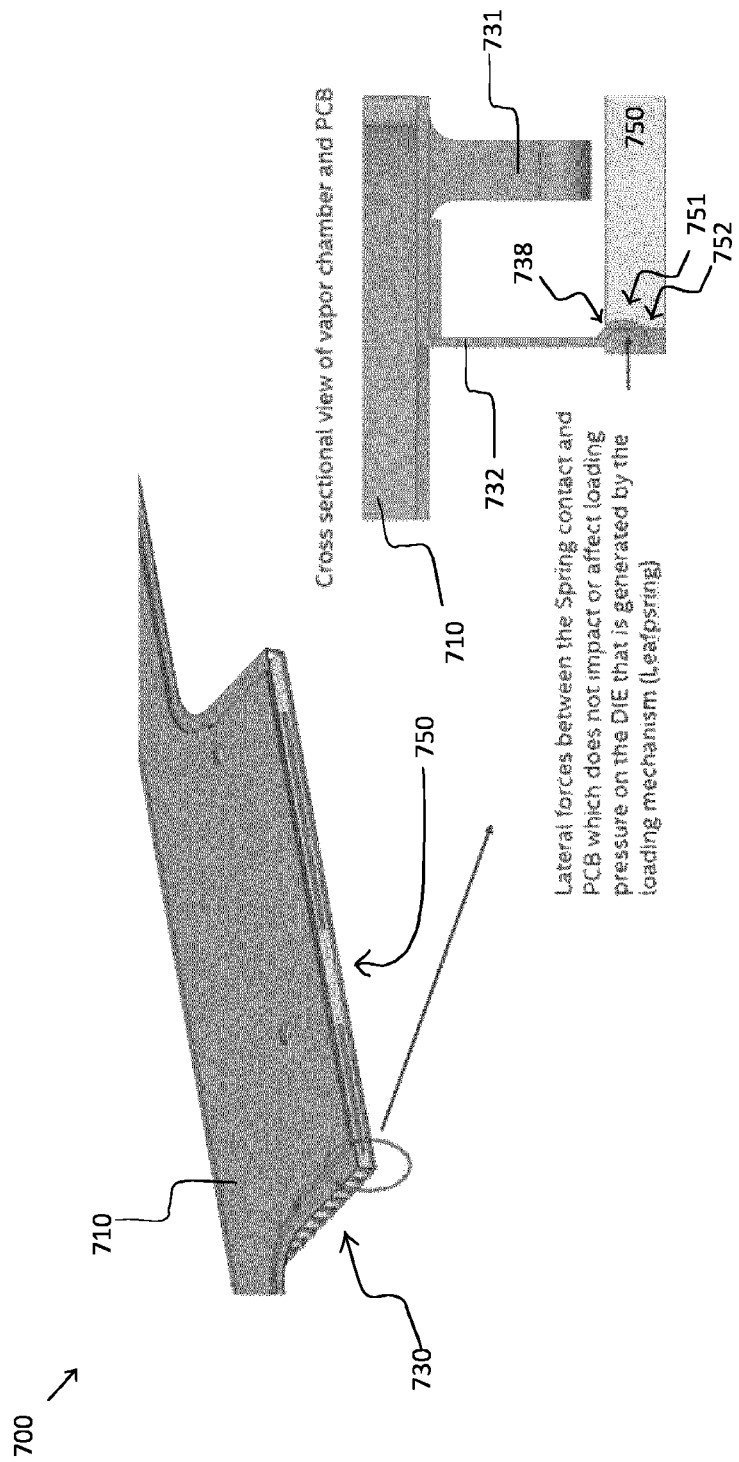
FIG. 7 illustrates an assembly of an electronic device.

FIG. 7 illustrates an assembly 700. The assembly 700 can be part of an electronic device, as described herein, and can include a vapor chamber 710 and circuit board 730. The vapor chamber 710 of FIG. 7 can be in accordance with the vapor chambers described herein. The circuit board 730 of FIG. 7 can be in accordance with the circuit boards described herein. The vapor chamber of FIG. 7 may include features and/or components of other vapor chambers described herein. The circuit board of FIG. 7 may include features and/or components of other vapor chambers described herein.

The vapor chamber 710 can include connectors 730 that couple to the circuit board 750. The connectors 730, 730, 732 can extend from a bottom of the vapor chamber 710. The connectors can fix the vapor chamber 710 to the circuit board 750 such that the bottom thermally couples to a heat source on the circuit board 750. The circuit board 750 can have a region for attachment of a heat source, and a connector assembly that couples to the vapor chamber 710 such that the vapor chamber 710 thermally couples to the heat source. The connector assembly can include attachment elements 751, such as rows of attachment elements.

The attachment elements 751 can include castellations, holes, receiving members (e.g. at edges of the circuit board 750), and/or recesses, for example. Attachment elements 751 can be integrated into the circuit board 750. The attachment elements 751 can receive complementary connectors (e.g. connectors 730, 731, 732) of the vapor chamber 710. For example, the attachments elements 751 receive spring-shaped and/or hook-shaped connectors. Alternatively/additionally, the attachment elements 751 make a snap-fit joint.

The connectors 730 can elastically deform such that a force is applied to the circuit board 750 in a plane of the circuit board 750. As seen in FIG. 7, the bottom of the vapor chamber may have a flat coupling surface and/or bottom plate. The connectors 730 can extend perpendicularly from the bottom of the vapor chamber 710. The connectors 730 can connect to a connector assembly, such as one including the complementary connectors 730, 731, 732, of the circuit board 750. The connectors 730 can have a contact surface 738 that connects to a complementary feature 752 of the circuit board 750. The contact surface 738 can possibly provide a snap-fit interaction with the complementary feature 752. Alternatively/additionally, the connector assembly of the circuit board 750 interacts with the contact surface 738, e.g. via attachment elements such as castellations, holes, receiving members, and/or recesses. The contact surface 738 can include a protrusion 738 that contacts a complementary feature 752, such as a recess, hole, or castellation, of the circuit board for fixing the vapor chamber 710 to the circuit board 750.

The contact surface 738 of the connector 730 can make contact with a lateral surface of the circuit board. Alternatively/additionally, a complementary feature 752, such as a castellation, hole, or recess, connects to a the contact surface 738 of the vapor chamber, for fixing the vapor chamber to the circuit board. Alternatively/additionally, the complementary features 752 may have a contact surface which connects to a complementary feature of the vapor chamber. The contact surface of the circuit board may include a portion oriented perpendicular to the planar surface of the circuit board and/or vapor chamber. Alternatively/additionally, the contact surface of either the connector 730 or attachment elements of the circuit board includes a ledge that is configured to contact a complementary ledge for fixing the vapor chamber to the circuit board.

Figure 8:
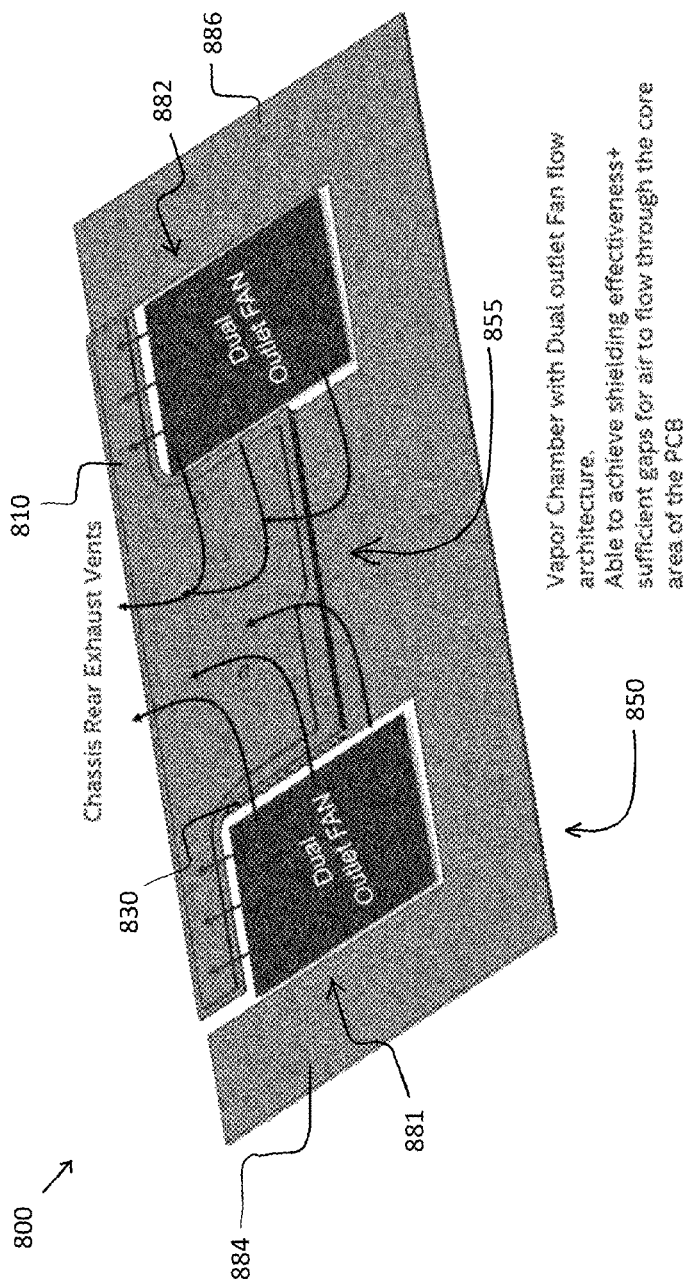
FIG. 8 illustrate an assembly of an electronic device.

FIG. 8 illustrates an assembly 800. The assembly 800 can be part of an electronic device, as described herein, and can include a vapor chamber 810 and circuit board 830. The vapor chamber 810 of FIG. 8 can be in accordance with the vapor chambers described herein. The circuit board 830 of FIG. 8 can be in accordance with the circuit boards described herein. The vapor chamber of FIG. 8 may include features and/or components of other vapor chambers described herein. The circuit board of FIG. 8 may include features and/or components of other vapor chambers described herein.

The vapor chamber 810 can include connectors 830 that couple to the circuit board 850. The connectors 830 can extend from a bottom of the vapor chamber 810. The connectors can fix the vapor chamber 810 to the circuit board 850 such that the bottom thermally couples to a heat source on the circuit board 850. The circuit board 850 can have a region for attachment of a heat source, and a connector assembly that couples to the vapor chamber 810 such that the vapor chamber 810 thermally couples to the heat source. The vapor chamber 810 can span over the region.

The vapor chamber 810 and/or circuit board 850 can assemble with a first and second fan 881, 882, as shown in FIG. 8. When a T-shaped vapor chamber is used, the first and second fans 881, 882 may be located beneath the crossbar of the T, as depicted in FIG. 8. Air can pass over the top plate of the vapor chamber 810, e.g. as driven by the fan.

The circuit board 850 can have a middle leg 855 on which the region for the heat source is located. The middle leg 855 of the circuit board can include the first row and second row of attachment elements. The vapor chamber 810 and/or circuit board 850 can assemble with a first fan 881 on a first side of the middle leg 885 and second fan 882 on a second side of the middle leg 885. The circuit board can include a first outer leg 884 and a second outer leg 886. The first fan 881 can be between the first outer leg 884 and the middle leg 885, and the second fan 882 can be between the second outer leg 886 and the middle leg 885. Air can be drawn from beneath the circuit board 800; air can be drawn from between the middle leg 885 and the first outer leg 884, and air can be drawn from between the middle leg 885 and the second outer leg 886.

Figure 9A:
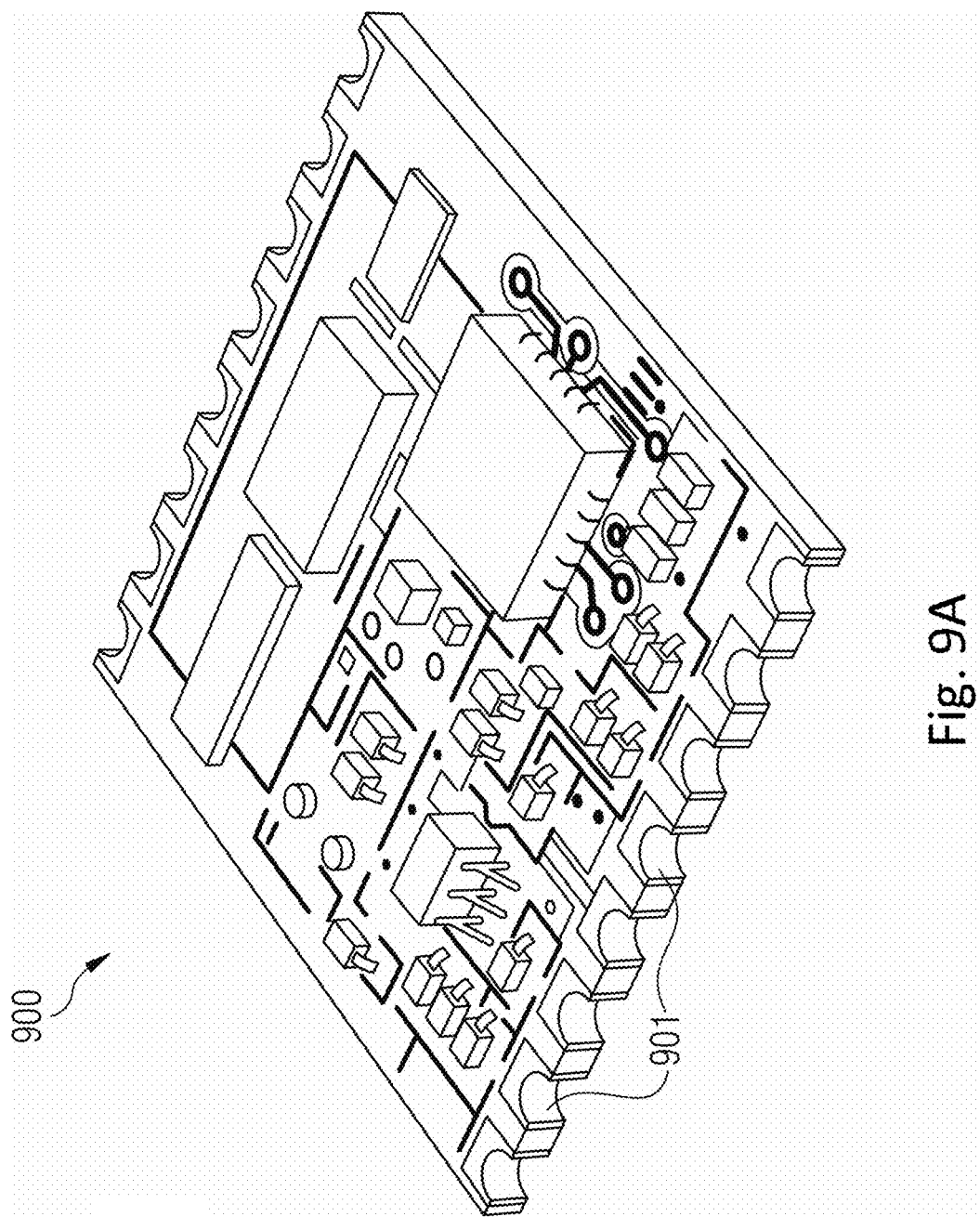
FIG. 9A illustrates a circuit board.

FIG. 9A illustrates a circuit board 900. The circuit board 900 can be in accordance with the circuit boards described herein. The circuit board of FIG. 9A may include features and/or components of other vapor chambers described herein. The connector assembly 901 can include attachment elements, such as rows of attachment elements, e.g. rows of castellations. The circuit board 900 can have conductive contacts configured to make electrical contact with the vapor chamber.

Figure 9B:
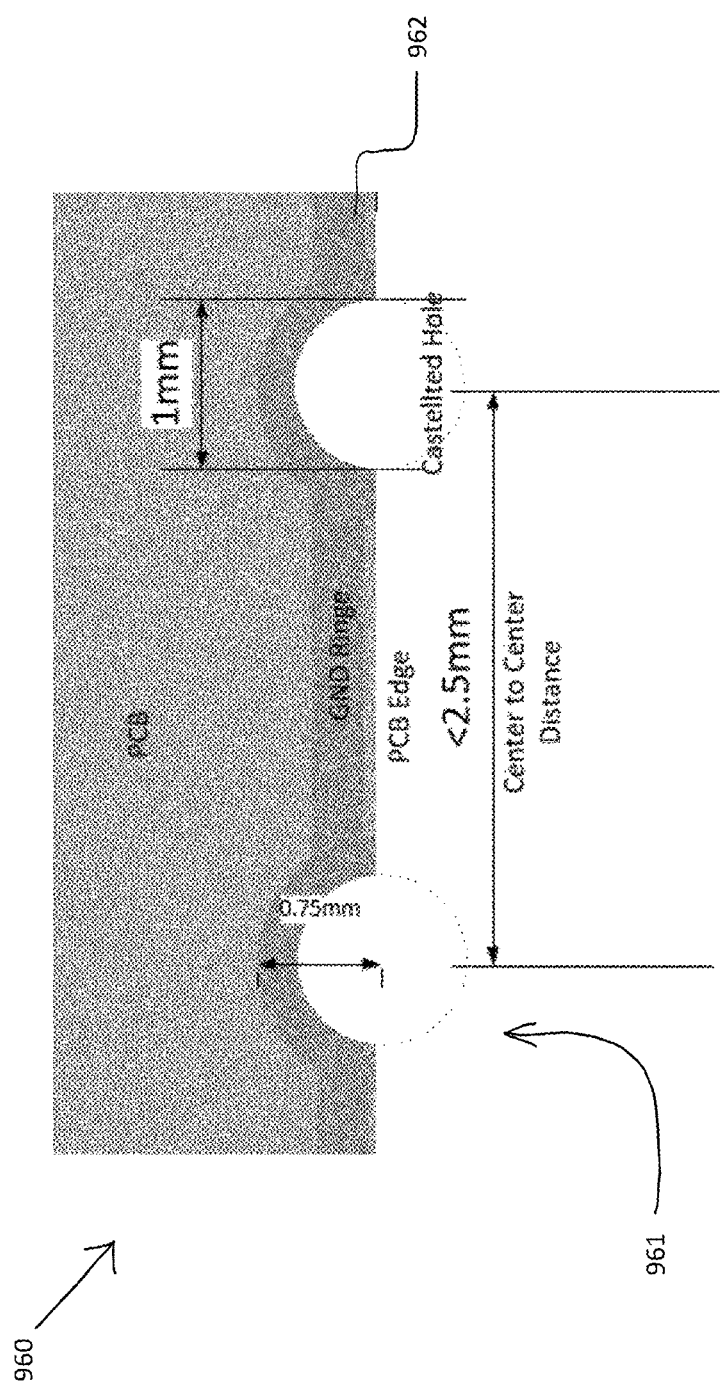
FIG. 9B illustrates a circuit board.

FIG. 9B illustrates a circuit board 960. The circuit board 960 can be in accordance with the circuit boards described herein. The circuit board of FIG. 9B may include features and/or components of other vapor chambers described herein.

The circuit board 960 can have a region for attachment of a heat source and a connector assembly 961 that can couple to a vapor chamber such that the vapor chamber thermally couples to the heat source. The connector assembly 901 can include attachment elements, such as rows of attachment elements, e.g. rows of castellations. FIG. 9B illustrates castellations, e.g. castellated holes. The circuit board 960 can have conductive contacts configured to make electrical contact with the vapor chamber. A ground ring 962 can be in electrical contact with the attachment element, e.g. such that when the vapor chamber is attached to the circuit board 960, the vapor chamber is in electrical communication with the ground ring. Alternatively/additionally, the connectors of the vapor chamber are electrically connectable to the ground ring 962, for example, so that the electromagnetic shielding of the vapor chamber is electrically connected to the ground of the circuit board.

Castellations can have a cross-sectional length along the edge of the circuit board 960 of between 0.75 and 1.25 mm, such as 1 mm, for example. The castellations can have a center-center distance along the edge of the circuit board 960 of 2.5 mm or less, for example.

Castellations or holes can formed by drilling into the circuit board, plating in a through-hole procedure, and then optionally cutting the circuit board (for castellations for example). Plating the hole and/or castellation can ensure good electrical contact with the vapor chamber. There can be additional milling and/or deburring as well. The holes can be 0.5 mm to 1.5 mm for example. The spacing between holes can be less than 2.5 mm. The spacing can be at least 0.5 mm.

The castellations can be at edges of the circuit board 960. The castellations can provide a ground contact for connectors from the vapor chamber. The contact can be at the vertical edge of the circuit board (see also for example the attachment elements 751 described with respect to FIG. 7).

Figure 10B:
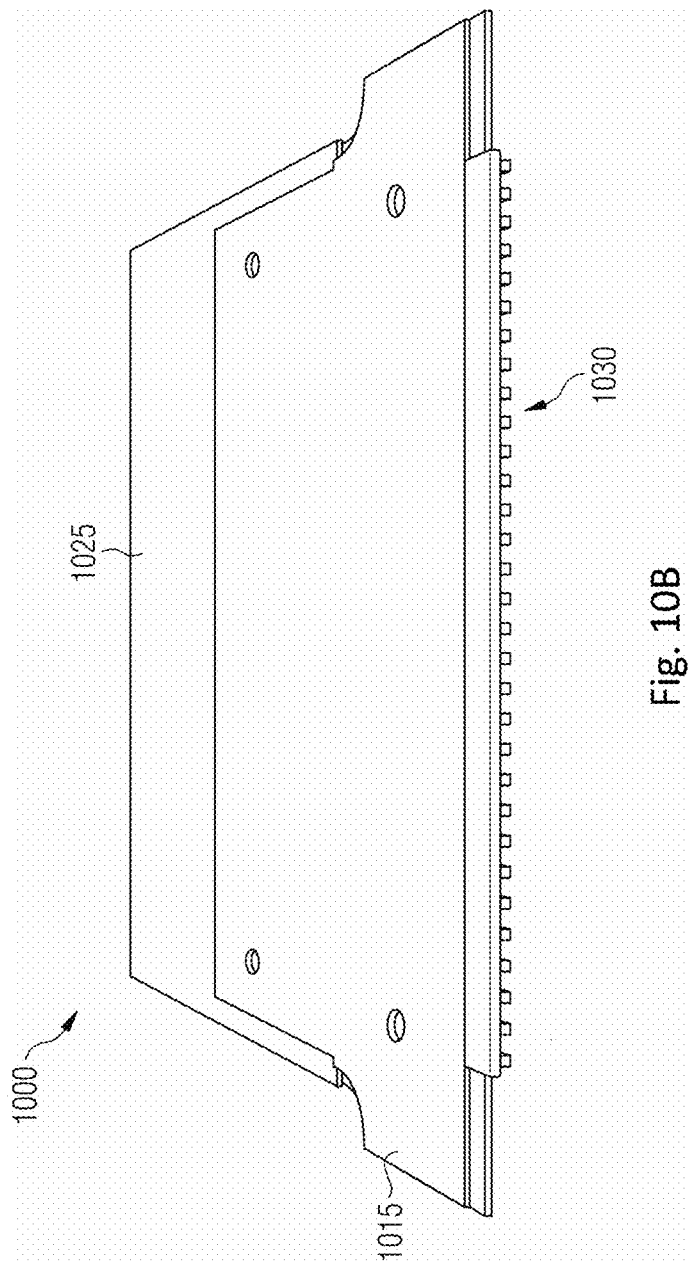
FIG. 10B illustrates a vapor chamber.
Figure 10C:
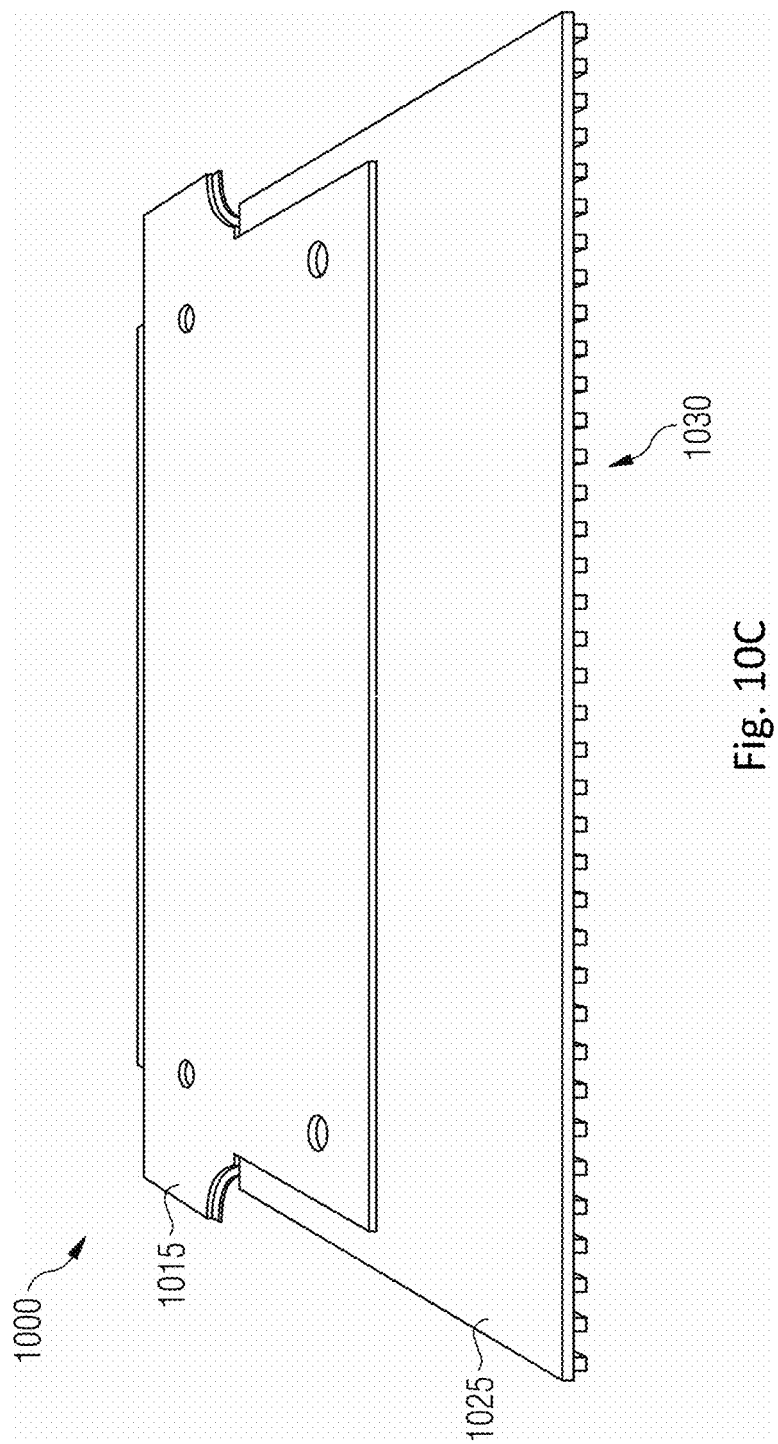
FIG. 10C illustrates a vapor chamber.

FIGS. 10A, 10B, and 10C illustrate a vapor chamber 1000. The vapor chamber 1000 can be in accordance with the vapor chambers described herein. The vapor chamber may include features and/or components of other vapor chambers described herein.

The vapor chamber 1000 can include connectors 1030 that couple to the circuit board. The connectors 1030 can extend from a bottom of the vapor chamber 1000. The connectors 1030 can fix the vapor chamber 1000 to a circuit board such that the bottom of the vapor chamber 1000 thermally couples to a heat source on the circuit board. The vapor chamber 1000 can include a bottom plate 1025 and a top plate 1015 spaced from the bottom plate 1025 forming a chamber therebetween. The connectors 1030 can include structures formed in the bottom plate 1025, e.g. extending downward from the bottom of the vapor chamber. The connectors 1030 can be cantilevers, fingers, and/or prongs, for example. Alternatively/additionally, the connectors 1030 can be fixed to the bottom of the vapor chamber 1000.

The electronic devices, vapor chambers, and circuit boards described herein may overcome various disadvantages of the current state of the art. Combining shielding and cooling can reduce tolerance requirements, for example, such as by saving space.

Figure 11B:
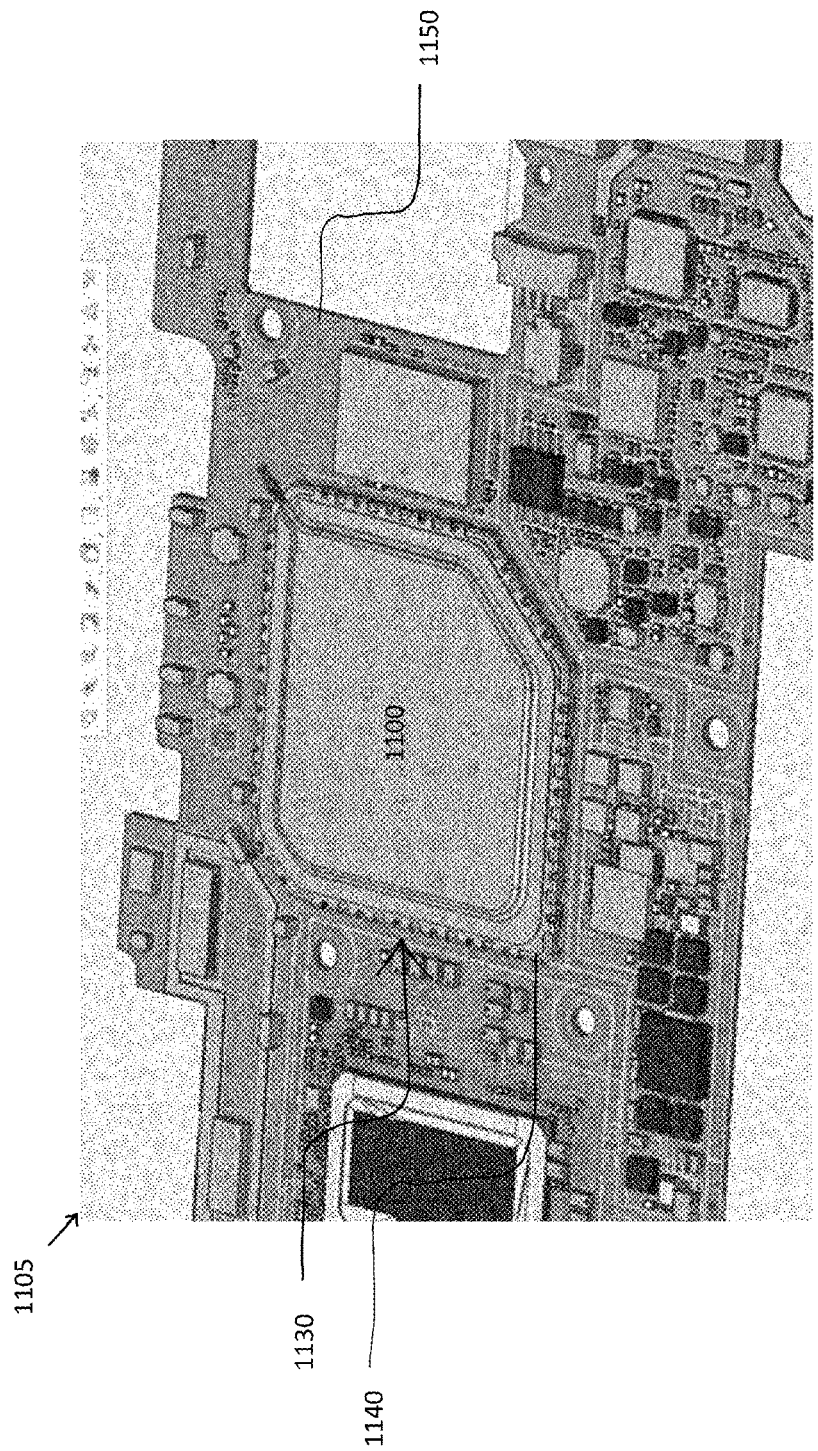

FIGS. 11A and 11B illustrate an electronic device 1105 including a vapor chamber 1100 thereof. The vapor chamber 1100 and/or circuit board 1150 of FIGS. 11A and 11B can have the features and/or functionalities of the vapor chambers and/or circuit boards described herein. The electronic device 1105 includes a vapor chamber 1100 and circuit board 1150. The circuit board 1150 has a heat source. The vapor chamber 1100 includes a plurality of connectors 1130 which can couple to the circuit board 1150. The connectors 1130 extend from a bottom of the vapor chamber 1100. The connectors can fix the vapor chamber 1100 to the circuit board 1150 such that the bottom of the vapor chamber 1100 thermally couples to the heat source on the circuit board 1150.

The connectors 1130 can be attached at a frame 1140 at the bottom of the vapor chamber 1100. The frame 1140 can be attached to the bottom of the vapor chamber 1100. A connector assembly 1141, which may be secured to a circuit board 1150, may complement the connectors 1130 and enable the vapor chamber 1100 to be secured to the circuit board 1150. The connector assembly 1141 can snap-fit to the vapor chamber 1100. Alternatively/additionally, a catch such as a locking wire can be used.

FIGS. 12A and 12B illustrate an electronic device 1205 and circuit board 1250 thereof. The vapor chamber 1200 and/or circuit board 1250 of FIGS. 12A and 12B can have the features and/or functionalities of the vapor chambers and/or circuit boards described herein. The electronic device 1205 includes a vapor chamber 1200 and circuit board 1250. The circuit board 1250 has a heat source 1255. The vapor chamber 1200 includes a plurality of connectors 1230 which can couple to the circuit board 1250. The connectors 1230 extend from a bottom of the vapor chamber 1200. The connectors 1230 can fix the vapor chamber 1200 to the circuit board 1250 such that the bottom of the vapor chamber 1200 thermally couples to the heat source 1255 on the circuit board 1250. The circuit board 1250 can have a connector assembly 1240 attached thereto. The connectors 1230 (which can be part of a frame 1240 attached to the vapor chamber 1200) can connect the vapor chamber 1200, such as a frame 1240 thereof to the connector assembly 1245.

The vapor chamber 1200 may have a frame 1240 attached to the bottom of the vapor chamber 1200. The connectors 1230 can be connected to the frame 1240. For example, a frame 1230 can be soldered welded, brazed, and/or attached by pressure sensitive adhesive to the bottom of the vapor chamber 1200 (see for example FIG. 12A). The connectors 1230 can alternatively be integrally formed to the bottom of the vapor chamber 1200.

FIG. 12A shows the circuit board 1250, the frame 1240, and the connector assembly 1245. The vapor chamber 1200 is not shown in FIG. 12A for clearer illustration of the frame 1240, and the connector assembly 1245.

FIG. 12B shows the circuit board 1250 and vapor chamber 1200 in an attached configuration. The frame 1240 can be attached, such as soldered, to the vapor chamber 1200. Alternatively, for example, the frame 1240 can be welded, brazed, or attached by pressure sensitive adhesive. The connectors 1230, 1280 can extend downward from the bottom of the vapor chamber 1200. A connector assembly 1245 can be attached to the circuit board 1250. The connector assembly and/or the vapor chamber 1200 can include at least one catch 1290.

At least one catch 1290, such as a releasable catch can aid in securing the vapor chamber 1200 to the circuit board 1250. The catch can aid in reversibly securing the vapor chamber 1200 to the circuit board 1250. At least one catch 1290 may be considered as part of the connector assembly 1245, the frame 1240, and/or the connectors 1230. Alternatively/additionally, at least one catch 1290 may be considered part of the vapor chamber 1200, circuit board 1250, and/or an electronic device which includes the vapor chamber 1200 and circuit board 1250. A catch 1290 can be a wire, such as a locking wire. A catch can be an elongate member, such as a wire, a band, a strip, and/or a cable.

The catch(es) 1290 may be configurable to release the vapor chamber 1200 from the circuit board 1250, such as by removal. The catch(es) 1290 can be pulled such that the vapor chamber 1200 is released.

The catch(es) 1290 can have a configuration in which it makes a snap-fit joint between the circuit board 1250 and the vapor chamber 1200. The catch(es) is configurable to snap-fit the vapor chamber to the circuit board.

Figure 13B:
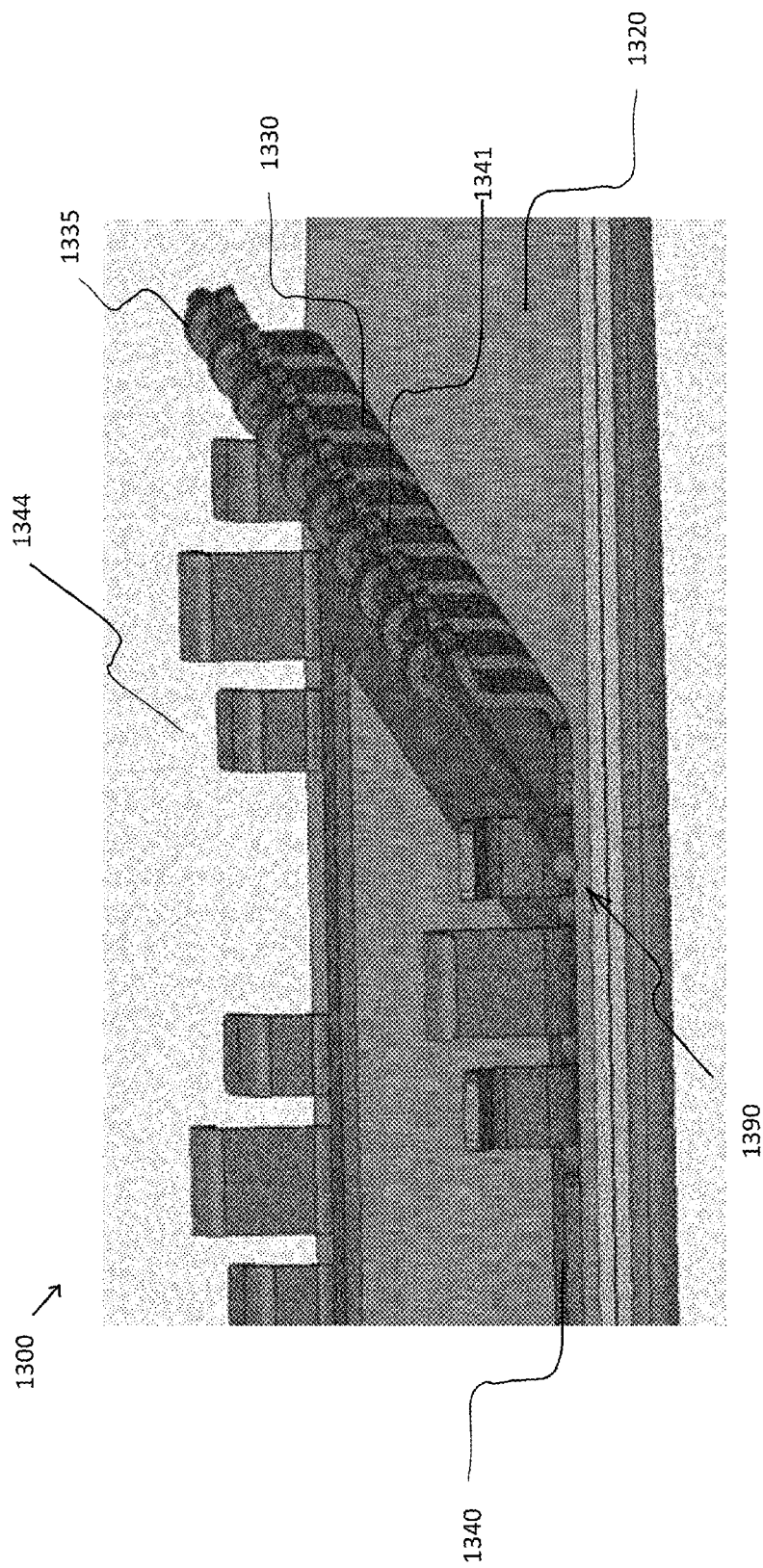

FIGS. 13A and 13B illustrate a vapor chamber 1300. The vapor chamber can have the features and/or functionalities of the vapor chambers described herein. The vapor chamber 1300 includes a plurality of connectors 1330 which can couple to a circuit board. The connectors 1330 extend from a bottom 1320 of the vapor chamber 1300. The connectors 1330 can fix the vapor chamber 1300 to a circuit board such that the bottom 1320 of the vapor chamber 1300 thermally couples to a heat source on the circuit board.

The vapor chamber 1300 may have a frame 1340 attached to the bottom of the vapor chamber 1300. The connectors 1330 can be connected to the frame 1340. For example, a frame 1340 can be soldered to the bottom of the vapor chamber 1300. The connectors 1330 can alternatively be integrally formed to the bottom of the vapor chamber 1300. Alternatively, for example, the frame 1340 can be welded, brazed, or attached by pressure sensitive adhesive.

At least one catch 1390 may be used to connect the vapor chamber 1300 to a circuit board. A catch 1390 can extend along an edge 1341, 1342, 1343, 1344 of the frame 1340, such as in a straight line. There can be more than one catch, such as a catch at any number of the edges 1341, 1342, 1343, 1344. The catch(es) can extend parallel to the plane of the circuit board and/or vapor chamber 1300, such as in a configuration in which the vapor chamber 1300 is secured to the circuit board. The catch(es) can be an elongate member, such as a wire, a band, a strip, and/or a cable. The catch(es) can make a snap-fit to attach the vapor chamber 1300 to a circuit board, such as via a snap-fit.

FIG. 13B shows a catch 1390, bottom 1320 of a vapor chamber 1300, and frame 1340. The connectors 1330 can include a plurality of hooks 1335, for example. Alternatively/additionally, there can be a plurality of hooks attached to the circuit board. A first plurality of hooks (e.g. connectors 1280 seen in FIG. 12B) on the circuit board (such as on the connector assembly 1245 thereof) can interdigitate with a second plurality of hooks 1335 of the vapor chamber 1300. The catch 1390 may secure to the first and second plurality of hooks, such as by a snap-fit joint. When the vapor chamber is secured to the circuit board, with the vapor chamber 1300 above the circuit board, the first plurality of hooks (e.g. connectors 1280) of the circuit board may extend above the plane of the catch 1290; and the second plurality of hooks 1335 of the vapor chamber may extend below the plane of the catch 1390. The vapor chamber may be below the catch 1390, and the circuit board above the catch 1390.

The catch 1390 may secure the vapor chamber 1300 to the circuit board, such as by providing for a vertical contact force with each of the first and second pluralities of hooks from the respective circuit board and vapor chamber.

Figure 14A:
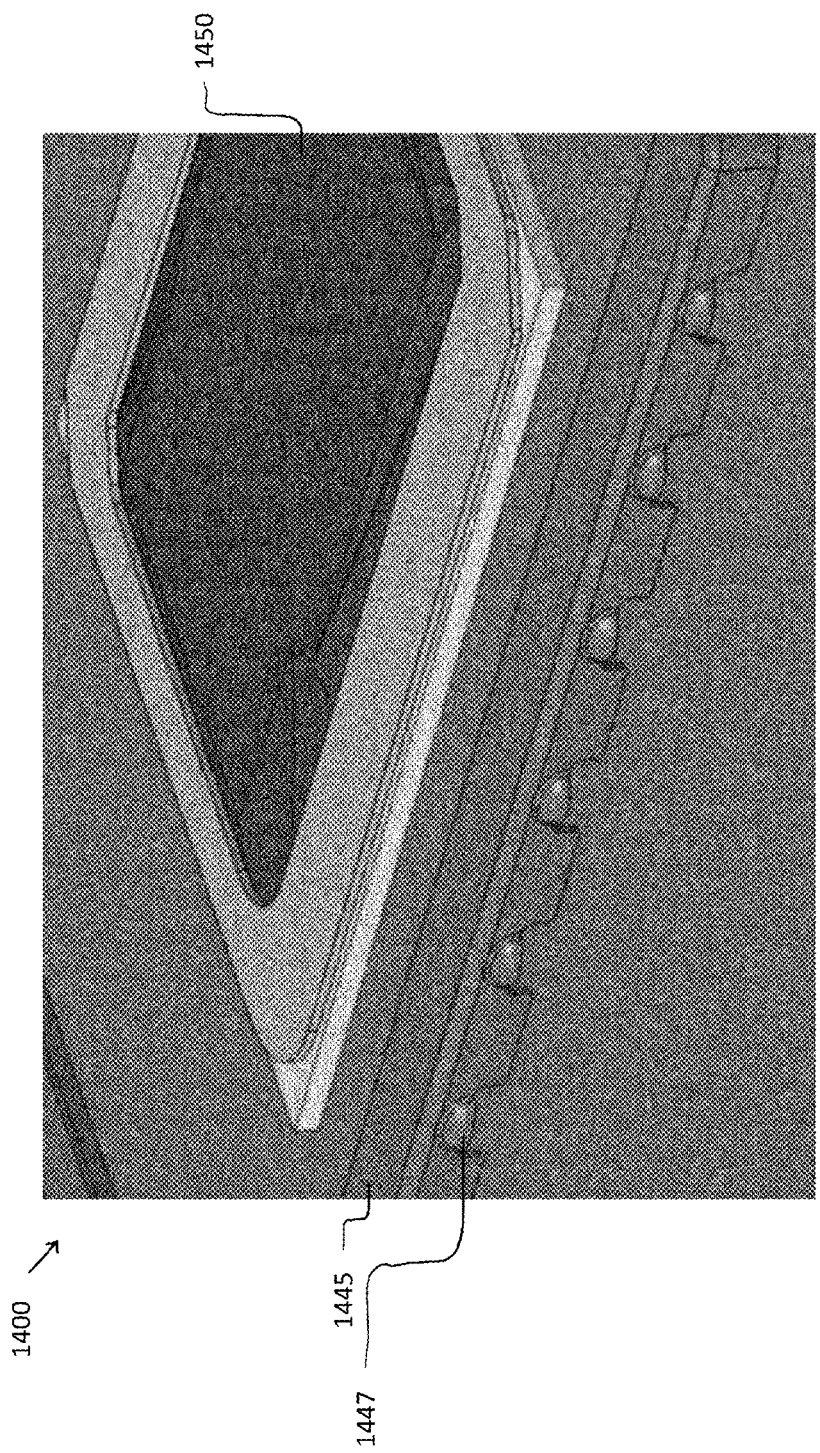
Figure 14B:
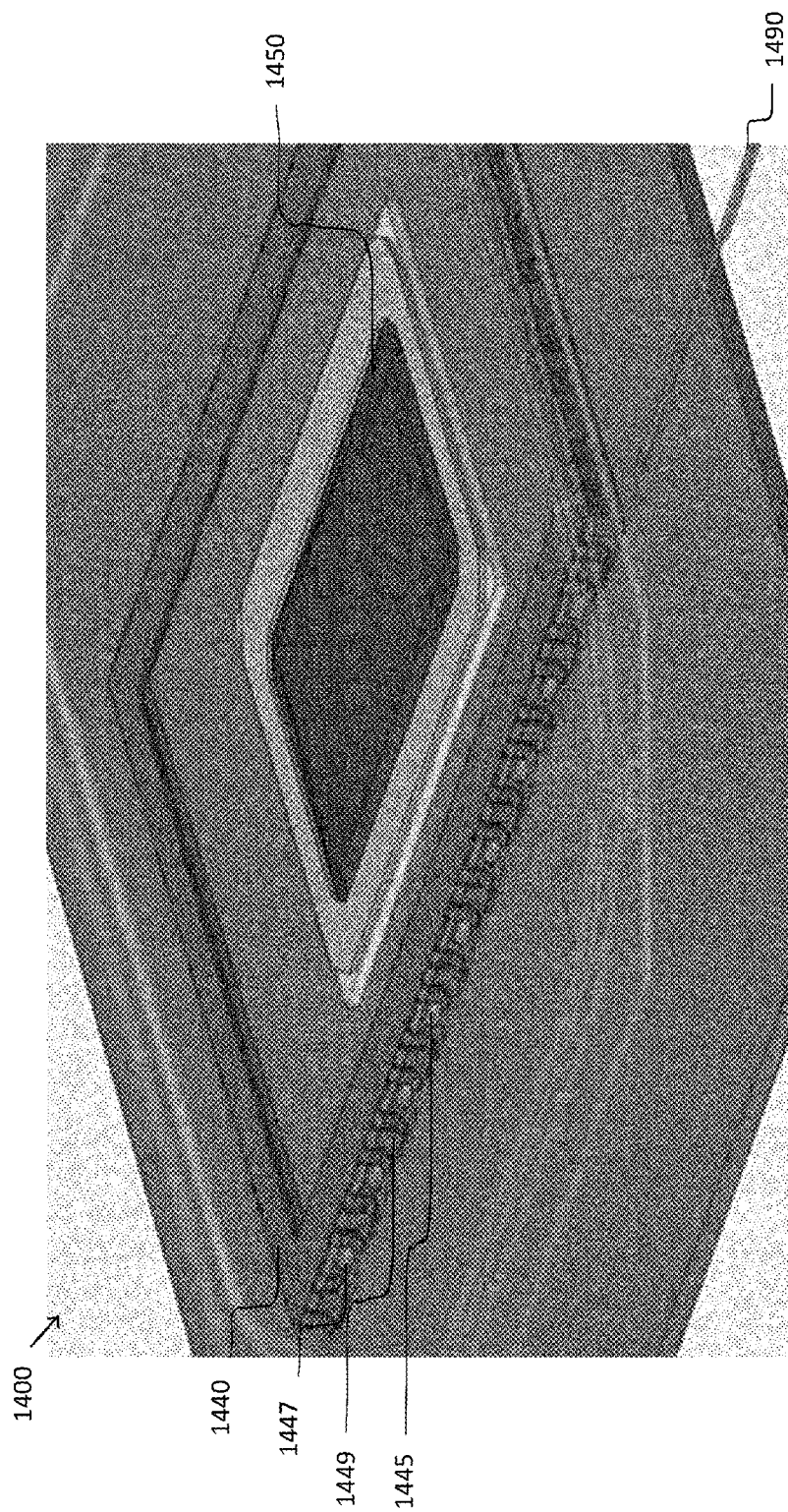

FIGS. 14A and 14B illustrate a circuit board. The circuit board 1400 can have the features and/or functionalities of the circuit boards described herein. The circuit board 1400 has a heat source 1450. The heat source 1450 can be attached to a region of the circuit board 1400. A vapor chamber can thermally couple to the heat source 1450. A connector assembly 1445 of the circuit board 1400 can couple the vapor chamber to the heat source 1450. The region on which the heat source 1450 is attached can be spanned by the vapor chamber.

The connector assembly 1445 can include hooks 1447, bumps, and/or connectors that can interact with a catch 1490. The catch 1490 may be removable, and may releasably secure a vapor chamber to the circuit board 1400. The contact force of the catch 1490 on the hooks 1447 of the connector assembly 1445 (attached to the circuit board 1400) and the contact force of the catch 1490 on the connectors 1449 (such as hooks of a frame 1440) of the vapor chamber may be directed in the vertical direction.

FIG. 14B shows the circuit board 1400, the catch 1490, a frame 1440 of a vapor chamber (the vapor chamber is not shown), and the connector assembly 1440.

FIG. 14C shows the circuit board, the heat source 1450, a frame 1440 of a vapor chamber (the vapor chamber is not shown) and connector assembly 1445 in a connected state (such as with a catch 1490). FIG. 14C shows an optional shielding foam 1470. The shielding foam 1470 can reduce the chance of RF leaks. The shielding foam 1470 can be between the vapor chamber and the circuit board 1400.

Figures 15A, 15B:
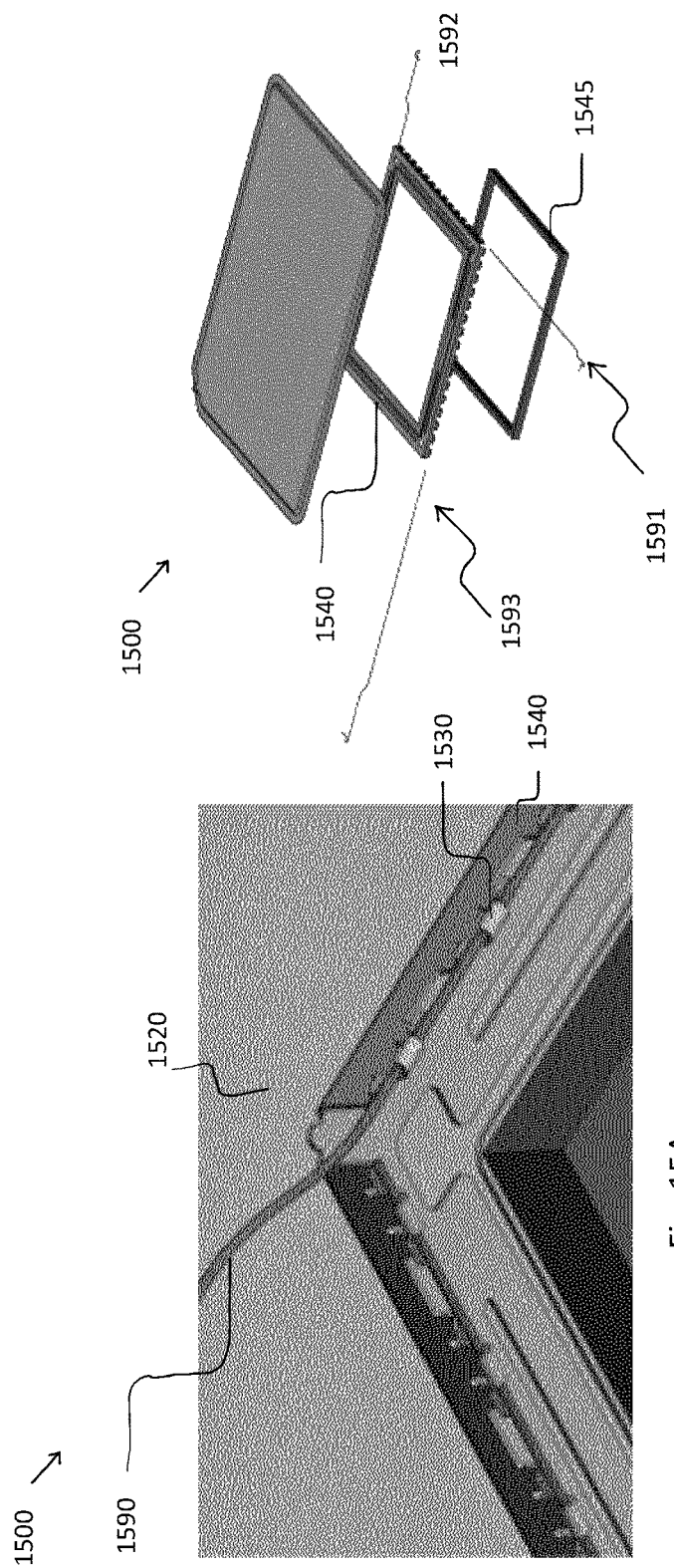
FIGS. 15A and 15B illustrate a vapor chamber.

FIGS. 15A and 15B illustrate a vapor chamber. The vapor chamber 1500 can have the features and/or functionalities of the vapor chambers described herein. The vapor chamber 1500 includes a plurality of connectors 1530 which can couple to a circuit board. The connectors 1530 extend from a bottom 1520 of the vapor chamber 1500. The connectors 1530 can fix the vapor chamber 1500 to a circuit board such that the bottom 1520 of the vapor chamber 1500 thermally couples to a heat source on the circuit board.

The vapor chamber 1500 may have a frame 1540 attached to the bottom 1520 of the vapor chamber 1500. The connectors 1530 can be connected to the frame 1540. The connectors 1530 can attach, via a catch 1590, to a connector assembly 1545 attached to the circuit board. More than one catch 1591, 1592, 1593 can be used. The catch(es) 1591, 1592, 1593 may be configurable, such as removable, to reversibly attach the vapor chamber 1500 to a circuit board, such as a connector assembly 1545 thereof.\

FIG. 16 shows a circuit board. The circuit board 1600 can have the features and/or functionalities of the circuit boards described herein. The circuit board 1600 has a heat source. The heat source can be attached to a region of the circuit board 1600. A vapor chamber can thermally couple to the heat source 1600. A connector assembly 1645 of the circuit board 1600 can couple a vapor chamber to the heat source.

The connector assembly 1645 can have a plurality of attachment elements 1646. The attachment elements 1646 may include hooks, bumps, and/or latches. The attachment elements 1646 may be part of a frame that is attached to the circuit board (e.g. the connector assembly 1645 may be a frame).

FIGS. 17A and 17B illustrate the attachment of a vapor chamber to a circuit board. The vapor chamber and/or circuit board of FIGS. 17A and 17B can have the features and/or functionalities of the vapor chambers and/or circuit boards described herein. The circuit board 1710 has a heat source. The vapor chamber 1700 includes a plurality of connectors 1730 which can couple to the circuit board 1720. The connectors 1730 extend from a bottom of the vapor chamber 1700. The connectors 1730 can fix the vapor chamber 1700 to the circuit board 1720 such that the bottom of the vapor chamber 1700 thermally couples to the heat source on the circuit board 1720. The heat source can be attached to a region of the circuit board 1720. The vapor chamber 1700 can thermally couple to the heat source. A connector assembly 1745 can couple the vapor chamber 1700 to the heat source.

FIG. 17A shows an optional frame 1740 attached to the vapor chamber 1700. The connectors 1730 are attached to the bottom of the vapor chamber 1700 via the frame 1740. The circuit board 1720 has a connector assembly 1745 attached thereto. FIG. 17A illustrates the vapor chamber 1700 and circuit board 1720 before the attachment of vapor chamber 1700 to the circuit board 1720. The catch 1790 is held by the connectors 1730 of the vapor chamber 1700. The attachment elements 1746 of the connector assembly 1745 attached to the circuit board 1720 are not yet in contact with the catch 1790.

FIG. 17B shows the vapor chamber 1700 attached to the circuit board 1720. The catch 1790 can secure the vapor chamber 1700 to the circuit board 1720, e.g. by attaching to (such as by latching and/or snap-fitting) to a plurality of connectors (e.g. a plurality of hooks) of the vapor chamber 1700 and attaching to (such as by latching and/or snap-fitting) to attachment elements 1746 (e.g. another plurality of hooks) of a connector assembly 1745 attached to the circuit board 1720. The connector assembly 1745 can be a fence, for example, that is attached to the circuit board 1720. The catch 1790 can be removed to release the vapor chamber 1700 from the circuit board 1720. The catch 1790 can be pulled out to release the vapor chamber 1700 from the circuit board 1720.

Figures 18A, 18B:
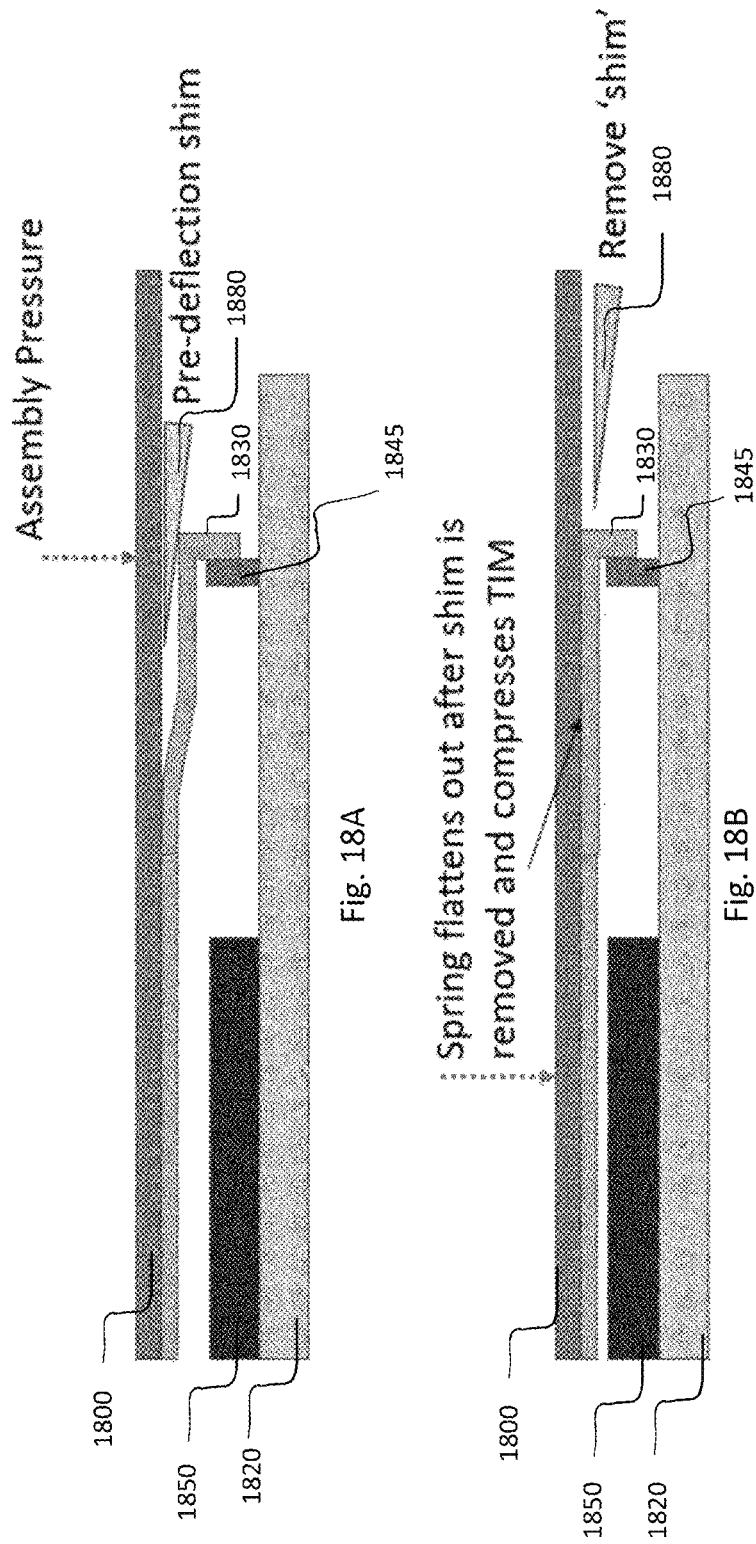

FIGS. 18A and 18B show an electronic device. The vapor chamber 1800 and/or circuit board 1820 of FIGS. 18A and 18B can have the features and/or functionalities of the vapor chambers and/or circuit boards described herein. The circuit board 1820 has a heat source 1850. The vapor chamber 1800 includes a connector 1830 which can couple to the circuit board 1820. The connectors 1830 extend from a bottom of the vapor chamber 1800. The connectors 1830 can fix the vapor chamber 1800 to the circuit board 1820 such that the bottom of the vapor chamber 1800 thermally couples to the heat source 1850 on the circuit board 1820. The heat source 1850 can be attached to a region of the circuit board 1820. The vapor chamber 1800 can thermally couple to the heat source 1850. A connector assembly 1845 can couple the vapor chamber 1800 to the heat source 1850. The circuit board 1820 can have a connector assembly 1845 attached thereto.

In FIG. 18A, a shim 1880 is held to the vapor chamber 1800. The connector 1830 of the vapor chamber 1800 is attached to the connector assembly 1845 of the circuit board 1820. The vapor chamber 1800 is fixed to the circuit board 1820. The connector 1830 includes a spring. A shim 1880 is to be removed, to release the spring of the connector 1830.

In FIG. 18B, the shim 1880 is removed. The spring can be flattened. The spring of the connector 1830 compresses the vapor chamber 1800 toward the heat source 1850. A TIM between the vapor chamber 1800 and heat source 1850 can be compressed. The use of the shim 1880 may allow for better thermal contact between the vapor chamber 1800 and the heat source 1850. The shim 1880 can be a thin film material. When the shim 1880 is removed, a compressive force can increase between the vapor chamber 1800 and the heat source 1850, such as a die.

A vapor chamber 1800 can include a removable shim 1880 that, when the vapor chamber 1800 is attached to the circuit board 1820 and the shim 1880 is removed, a spring is released such that a compressive force is applied between the vapor chamber and the circuit board. The use and removal of the shim can aid in compression forces to thermally connect the vapor chamber 1800 to the heat source 1850.

FIG. 18C shows the use of an assembly tool 1882 that can alternatively/additionally aid in improving thermal contact between the vapor chamber 1800 and the heat source 1850. The assembly tool 1882 can apply pressure to increase the load and can aid in compression forces to thermally connect the vapor chamber 1800 to the heat source 1850.

Figure 19:
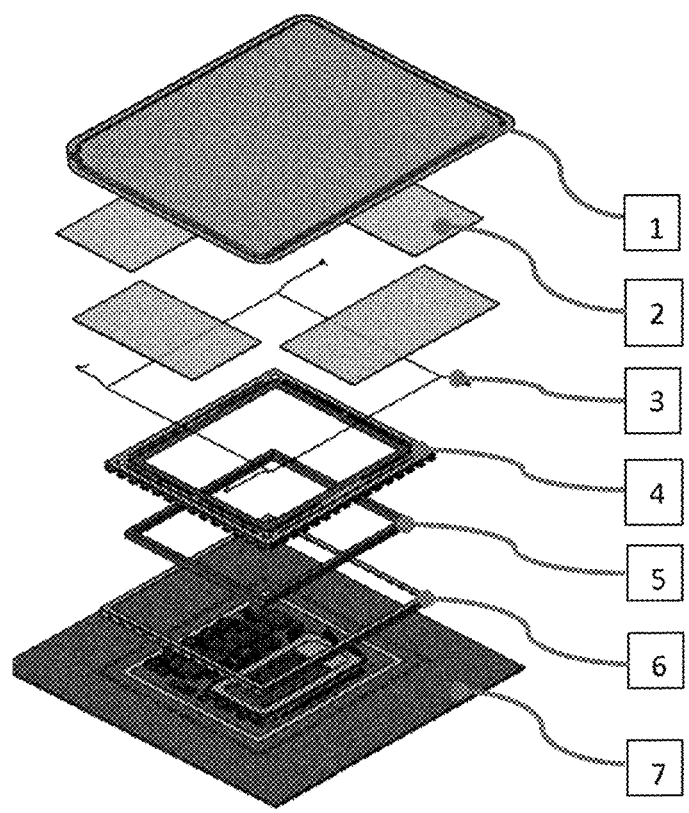
FIG. 19 illustrates assembly of a vapor chamber and circuit board.

FIG. 19 illustrates the assembly of the vapor chamber and circuit board. The vapor chamber and/or circuit board of FIG. 19 can have the features and/or functionalities of the vapor chambers and/or circuit boards described herein. The circuit board 7 has a heat source. The vapor chamber 1 includes a plurality of connectors 4 which can couple to the circuit board 7. The connectors 4 extend from a bottom of the vapor chamber 1. The connectors 4 can fix the vapor chamber 1 to the circuit board 7 such that the bottom of the vapor chamber 1 thermally couples to the heat source on the circuit board 7. The heat source can be attached to a region of the circuit board 7. The vapor chamber 1 can thermally couple to the heat source. A connector assembly 4 can couple the vapor chamber 1 to the heat source.

The assembly can use a connector assembly 6, such as a soldered fence, attached to the circuit board 7. The circuit board may be a printed circuit board (PCB). An optional electromagnetic shielding gasket 5 and/or foam can be attached to the circuit board 7, which may further reduce electromagnetic interference. At least one catch 3 can be used for securing the vapor chamber 1 to the circuit board 7, such as by enabling a snap-joint. The catch(es) 3 can be a wire(s). The catch 3 can allow for reversible and/or releasable attachment of the vapor chamber 1 to the circuit board 7. Optionally, shims 2 can be used, as described herein. For example, shims may be removed to increase the compressive force between the vapor chamber 1 and the heat source on the circuit board 7.

The vapor chamber and circuit board as described herein in an electronic device may allow for reduction in the thickness of the electronic device. The vapor chamber may additionally reduce electromagnetic interference as well as cool electronic components.

Figure 20:
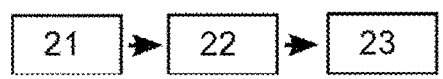
FIG. 20 illustrates a method of assembly.

FIG. 20 illustrates a method of assembling an electronic device. The method includes attaching 21 a heat source to a circuit board, attaching 22 a vapor chamber to a circuit board, and removing 23*a* shim to release a spring such that a compressive force between the vapor chamber and the heat source is increased. Attaching the vapor chamber to the circuit board can include forming a snap-fit joint among a removable catch, a connector attached to the bottom of the vapor chamber, and a frame attached to the circuit board. The vapor chamber can be released by removal of the catch.

The following examples pertain to examples in accordance with this specification. It will be understood that certain examples may be combined with certain other examples, in certain examples. Aspects described in the following examples may be combined with examples described with respect to one or more of the figures above and vice versa.

The following enumerated examples pertaining to a vapor chamber are disclosed.

Example 1 is a vapor chamber, comprising a plurality of connectors configured to couple to a circuit board. The plurality of connectors extends from a bottom of the vapor chamber. The plurality of connectors is configured to fix the vapor chamber to the circuit board such that the bottom thermally couples to a heat source on the circuit board.

Example 2. The vapor chamber of example 1, wherein the vapor chamber is configured to electromagnetically shield the heat source.

Example 3. The vapor chamber of any preceding example, wherein the vapor chamber includes an electromagnetic shielding material, such as a conductive material, such as a metal.

Example 4. The vapor chamber of any preceding example, wherein the vapor chamber includes an edge and an opposite edge, wherein the edge is configured to be along a corresponding edge of the circuit board, and the opposite edge of the vapor chamber is configured to be along a corresponding opposite edge of the circuit board.

Example 5. The vapor chamber of any preceding example, wherein the vapor chamber is configured to thermally couple to a heat source on the circuit board between the edge of the circuit board and the opposite edge of the circuit board.

Example 6. The vapor chamber of example 5, further comprising a flat coupling surface configured to thermally couple to the heat source.

Example 6b. The vapor chamber of any preceding example, further comprising a bottom plate and a top plate spaced from the bottom plate forming a chamber therebetween.

Example 6c. The vapor chamber of example 6b, further comprising a spacer and/or plurality of spacers spanning the chamber between the inside of the bottom plate and the inside of the top plate; wherein the spacers are optionally pillars.

Example 6d. The vapor chamber of any of examples 6b-6c, further comprising a gap between the inside of the bottom plate and the inside of the top plate.

Example 6e. The vapor chamber of any of examples 6b-6d, wherein the outside of the bottom plate is the bottom of the vapor chamber configured to couple to the heat source.

Example 7. The vapor chamber of any preceding example, further comprising a fluid within the chamber.

Example 7b. The vapor chamber of any preceding example, wherein the vapor chamber is T-shaped, for example the bottom plate and the top plate each having a T-shape.

Example 7c. The vapor chamber of example 7b, wherein the connectors extend from the stem of the T.

Example 7d. The vapor chamber of any of examples 7b-7c, wherein the stem of the T is configured to connect to the circuit board.

Example 7e. The vapor chamber of any of examples 7b-7d, wherein the edges of the stem of the T is configured to connect to edges the circuit board.

Example 7f. The vapor chamber of any of examples 7b-7e, wherein the vapor chamber is configured to assemble with a first fan and a second fan, each located beneath the crossbar of the T.

Example 7g. The vapor chamber of any example 7f, wherein the vapor chamber is configured to assemble with the first and second fans such that air passes over the top plate.

Example 8. The vapor chamber of any preceding example, wherein the plurality of connectors includes a conductor for making electrical contact with the circuit board.

Example 8b. The vapor chamber of any preceding example, wherein the plurality of connectors is configured to electrically connect the electromagnetic shielding material to a ground of the circuit board, such as a ground plane and/or ground ring of the circuit board.

Example 9. The vapor chamber of any preceding example, wherein the connectors include cantilever springs.

Example 10. The vapor chamber of any preceding example, wherein the plurality of connectors is configured to snap-fit to the circuit board.

Example 11. The vapor chamber of any preceding example, wherein the plurality of connectors is configured for making contact forces in directions in the plane of the circuit board.

Example 11b. The vapor chamber of any preceding example, wherein the plurality of connectors is configured for negligible contact forces in a direction perpendicular to the plane of the circuit board.

Example 12. The vapor chamber of any preceding example, wherein the connectors include a catch configured to secure the vapor chamber to the circuit board.

Example 12. The vapor chamber of any preceding example, wherein the plurality of connectors is configured to couple to edges and/or holes of the circuit board.

Example 13. The vapor chamber of any preceding example, wherein the connectors include a plurality of cantilevers, wherein a free end of each cantilever is configured to attach to the circuit board.

Example 13b. The vapor chamber of any preceding example, wherein the free ends are configured to flex in a direction in the plane of the circuit board.

Example 14. The vapor chamber of any preceding example, wherein the connectors include elastic cantilevers for making a snap-fit joint.

Example 15. The vapor chamber of any preceding example, wherein the plurality of connectors is conductive for making electrical contact with the circuit board.

Example 16. The vapor chamber of any preceding example, wherein the connectors include a first row of connectors opposite to a second row of connectors.

Example 16b. The vapor chamber of any preceding example, wherein the connectors include a first row of connectors opposite to a second row of connectors; and the free ends of the connectors of the first row are configured to make a contract force with the circuit board in a direction toward the free ends of the connectors of the second row.

Example 17. The vapor chamber of any preceding example, wherein the plurality of connectors is configured to flex in a direction in the plane of the circuit board.

Example 18. The vapor chamber of any one of examples 16-17, further comprising a third row of connectors along a line from an end of the first row to an end of the second row, the third row optionally extending from respective ends of the first and second rows.

Example 19. The vapor chamber of any preceding example, wherein the plurality of connectors is configured to engage with the circuit board by elastically deforming such that a force is applied to the circuit board in a plane of the circuit board.

Example 20. The vapor chamber of any preceding example, wherein the connectors extend perpendicularly from the bottom of the vapor chamber.

Example 20b. The vapor chamber of any preceding example, wherein the plurality of connectors is configured to connect to a connector assembly of the circuit board, the connector assembly optionally including at least one of castellations, recesses, and holes of the circuit board.

Example 21. The vapor chamber of any preceding example, wherein the connectors include a contact surface configured to connect to a complementary feature for fixing the vapor chamber to the circuit board.

Example 22. The vapor chamber of example 21, wherein the contact surface is configured to provide a snap-fit interaction with the complementary feature.

Example 23. The vapor chamber of example 22, wherein the contact surface is configured to provide a snap-fit interaction with castellations of the circuit board.

Example 24. The vapor chamber of any of examples 21-23, wherein the contact surface includes a protrusion that is configured to contact a complementary recess of the circuit board for fixing the vapor chamber to the circuit board.

Example 26. The vapor chamber of any of examples 16-25, wherein the first row is at an edge of the stem of the T-shaped vapor chamber and the second row is at an opposite edge of the stem of the T-shaped vapor chamber.

Example 27. The vapor chamber of any of examples 18-26, wherein the third row is at the southern edge of the stem of the T-shaped vapor chamber, wherein the third row is optionally configured to connect to a fence on the circuit board, wherein the fence is optionally ventilated.

Example 28. The vapor chamber of any of examples 16-27, further comprising an upper row of connectors at the northern edge of the crossbar of the T-shaped vapor chamber, and the upper row optionally connects an end of the first row with an end of the second row.

Example 29. The vapor chamber of any of examples 7b-28, wherein the first and second rows of the plurality of connectors are configured to attach, respectively, to opposite edges of the circuit board.

Example 30. The vapor chamber of any preceding example, wherein the plurality of connectors includes spring-shaped and/or hook-shaped connectors.

Example 31. The vapor chamber of any preceding example, wherein the plurality of connectors is integrally formed and/or soldered to the bottom.

Example 32. The vapor chamber of any preceding example, further comprising a frame attached to the bottom of the vapor chamber, wherein the plurality of connectors is connected to the frame.

Example 33. The vapor chamber of any preceding example, wherein each row of connectors comprises at least 4 connectors.

Example 34. The vapor chamber of any preceding example, wherein the connectors are from 1 mm to 10 mm long, from 2 to 8 mm, or from 3 to 6 mm, such as 4 to 5 mm, wherein the length is measurable from the bottom of the vapor chamber to a lowest end of the connector.

Example 35. The vapor chamber of any preceding example, wherein the largest dimension of the vapor chamber is up to 250 mm, up to 200 mm, or up to 150 mm, wherein the largest dimension is a width or a length.

Example 36. The vapor chamber of any preceding example, wherein the largest dimension of the vapor chamber is at least 50 mm, 60 mm 70 mm, or 80 mm, wherein the largest dimension of the vapor chamber is a width or length.

Example 37. The vapor chamber of any preceding example, wherein the electronic device has a thickness of up to 7 mm, 8 mm, 9 mm, or 10 mm.

Example 38. The vapor chamber of any preceding example, further comprising a removable shim, configured such that, when the vapor chamber is attached to the circuit board, and the shim is removed, a spring is released such that a compressive force is applied between the vapor chamber and the circuit board.

The following enumerated examples directed at a circuit board are hereby disclosed.

Example 1 is a circuit board, comprising a region configured for attachment of a heat source, a connector assembly configured to couple to a vapor chamber such that the vapor chamber thermally couples to the heat source.

Example 2. The circuit board of example 1, wherein the connector assembly is configured such that the vapor chamber spans the region.

Example 3. The circuit board of any preceding example, wherein the connector assembly includes a first row of attachment elements and a second row of attachment elements.

Example 4. The circuit board of any preceding example, wherein the region is between the first and second rows.

Example 5. The circuit board of any preceding example, further comprising a first edge and a second edge. The first and second edges are opposite to each other.

Example 6. The circuit board of any preceding example, wherein the first row is at the first edge and the second row is at the second edge.

Example 7. The circuit board of any preceding example, further comprising a middle leg of the circuit board which includes the first row and the second row.

Example 8. The circuit board of example 7, wherein the first and second rows are at opposite edges of the middle leg.

Example 9. The circuit board of any of examples 7-8, wherein the circuit board is configured to assemble with a first fan on a first side of the middle leg and second fan on a second side of the middle leg.

Example 10. The circuit board of any of examples 7-9, further comprising a first outer leg and a second outer leg Example 11. The circuit board of any of examples 9-10, wherein the circuit board is configured to assemble with the first fan between the first outer leg and the middle leg, and with the second fan between the second outer leg and the middle leg.

Example 12. The circuit board of any of examples 9-11, wherein the circuit board is configured to assemble with the first and second fans such that: air is drawn from beneath the circuit board, air is drawn from between the middle leg and the first outer leg, and air is drawn from between the middle leg and the second outer leg.

Example 13. The circuit board of any preceding example, further comprising a plurality of conductive contacts configured to make electrical contact with the vapor chamber.

Example 13b. The circuit board of any preceding example, wherein a ground of the circuit board is configured to make electrical contact with the vapor chamber.

Example 14. The circuit board of example 13, wherein the ground is configured to make electrical contact with the vapor chamber through the connector assembly.

Example 15. The circuit board of any preceding example, wherein the connector assembly is configured to snap-fit to the vapor chamber.

Example 16. The circuit board of any preceding example, wherein the connector assembly is configured to make contact forces with the vapor chamber in the plane of the circuit board.

Example 17. The circuit board of any preceding example, wherein the connector assembly is configured to make negligible contact forces in a direction perpendicular to the plane of the circuit board.

Example 18. The circuit board of any preceding example, wherein the connector assembly includes a catch configured to secure the circuit board to the vapor chamber.

Example 19. The circuit board of any preceding example, wherein the attachment elements include receiving members, such as at edges, castellations, and/or holes of the circuit board, which are configured to receive complementary connectors of the vapor chamber.

Example 20. The circuit board of any preceding example, wherein the attachment elements include a conductor configured for electrically contacting the complementary connectors, the conductor optionally being the ground plane of the circuit board.

Example 21. The circuit board of any preceding example, wherein the attachment elements are configured to attach to the complementary connectors of the vapor chamber, such as by snap-fit.

Example 22. The circuit board of any preceding example, wherein the attachment elements are configured to make a snap-fit joint.

Example 23. The circuit board of any preceding example, wherein the connector assembly includes a contact surface on a lateral surface of the circuit board, wherein the contact surface is configured to connect to a complementary feature of the vapor chamber for fixing the vapor chamber to the circuit board.

Example 24. The circuit board of example 23, wherein the contact surface is configured to provide a snap-fit interaction with the complementary feature.

Example 25. The circuit board of any of examples 22-24, wherein the contact surface includes a ledge that is configured to contact a complementary ledge for fixing the vapor chamber to the circuit board.

Example 26. The circuit board of any preceding example, wherein the first row is at an edge of the middle leg, and the second row is at an opposite edge of middle leg.

Example 26. The circuit board of any preceding example, wherein a third row of attachment elements along a line from the first row to the second row.

Example 27. The circuit board of any preceding example, wherein the third row includes a fence structure on the circuit board.

Example 28. The circuit board of example 26 or 27, wherein the third row is south of the region for attachment of the heat source.

Example 29. The circuit board of any of example 26-28, wherein the third row includes vents, such as vents which lead to the heat source.

Example 30. The circuit board of any preceding example, further comprising an upper row of connectors at the northern edge of the circuit board.

Example 30b. The circuit board of example 30, wherein the first, second, third, and upper rows of connectors surround the region.

Example 31. The circuit board of any preceding example, wherein the first and second rows of attachment elements are configured to connect, respectively, to opposite edges of the vapor chamber.

Example 32. The circuit board of any preceding example, wherein the attachment elements are configured to receive spring-shaped and/or hook-shaped connectors.

Example 33. The circuit board of any preceding example, wherein the attachment elements are recesses or castellations at an edge of the circuit board.

Example 34. The circuit board of any preceding example, wherein the attachment elements include holes in the circuit board.

Example 35. The circuit board of any preceding example, wherein the connector assembly includes at least one catch.

Example 36. The circuit board of example 35, wherein the catch includes at least one elongate member such as a wire, a band, a strip, and/or a cable.

Example 37. The circuit board of any of examples 35-36, wherein the catch is configurable to reversibly secure the vapor chamber to the circuit board.

Example 38. The circuit board of any of examples 35-37, wherein the catch is configurable to release the vapor chamber from the circuit board.

Example 39. The circuit board of any of examples 35-38, wherein the catch is configurable to make a snap-fit joint to the vapor chamber.

Example 40. The circuit board of any of examples 35-39, wherein the catch is configurable to snap-fit the vapor chamber to the circuit board.

Example 41. The circuit board of any of examples 35-40, wherein the catch is removable.

Example 42. The circuit board of any of examples 35-41, wherein the catch is removable such that removal of the catch releases the vapor chamber from the circuit board.

Example 43. The circuit board of any of examples 35-42, wherein the catch can be pulled such that the vapor chamber is released.

Example 44. The circuit board of any of examples 35-43, wherein the catch extends around an edge of a frame when configured for making a snap-fit with the vapor chamber.

Example 45. The circuit board of any of examples 35-44, further comprising a plurality of catches.

Example 46. The circuit board of any of examples 35-45, wherein the catch(es) extends along an edge of a frame.

Example 47. The circuit board of any of examples 35-46, wherein the catch is configured to extend parallel to the plane of the circuit board when configured to secure the vapor chamber.

Example 48. The circuit board of any of examples 35-47, further comprising a first plurality of hooks configured to interdigitate with a second plurality of hooks of the vapor chamber.

Example 49. The circuit board of any of examples 35-48, wherein in the secured configuration, the first plurality of hooks extend above the plane of the catch.

Example 50. The circuit board of example 49, wherein in the secured configuration, the catch is configured such that the second plurality of hooks extend below the plane of the catch.

Example 51. The circuit board of example 50, wherein in the secured configuration, the catch is configured to make a vertical contact force with each of the first and second plurality of hooks.

Example 52. The circuit board of any preceding example, wherein the heat source is at least one of a processor, a transmitter, a receiver, a transceiver, a field programmable gate array, an amplifier, and an integrated circuit.

Another set of examples are directed at an electronic device that includes the vapor chamber according to any one of the examples 1-38 and the circuit board according any one of the examples 1-52. For example, herein is disclosed an electronic device that includes the vapor chamber according to example 1 and the circuit board according any of the examples 1-52, and an electronic device that includes the vapor chamber according to example 2 and the circuit board according any of the examples 1-52 . . . and an electronic device that includes the vapor chamber according to example 38 and the circuit board according any of the examples 1-52, and an electronic device that includes the circuit board according to example 1 and any of the vapor chambers of examples 1-37 . . . and an electronic device according to example 52 and any of the vapor chambers of examples 1-38. The set of examples of electronic devices can further include at least one fan (such as two fans), such as (1) a first fan on a first side of a middle leg of the circuit board, and a second fan on a second side of the middle leg; (2) a first fan between the first outer leg and the middle leg, and a second fan between the second outer leg and the middle leg; and/or (3) first and second fans which are such that: (i) air is drawn from beneath the circuit board, (ii) air is drawn from between the middle leg and the first outer leg, and (iii) air is drawn from between the middle leg and the second outer leg.

Herein is disclosed the following methods for assembling an electronic device.

Example 1. A method of assembling an electronic device, comprising attaching a heat source to a circuit board, attaching a vapor chamber to a circuit board, and removing a shim to release a spring such that a compressive force between the vapor chamber and the circuit board is increased.

Example 2. The method of the above example 1, wherein attaching the vapor chamber to the circuit board includes forming a snap-fit joint among a removable catch, a connector attached to the bottom of the vapor chamber, and a frame attached to the circuit board, wherein the attachment of the vapor chamber to the circuit board is reversible by removal of the catch.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

Herein the connectors of the vapor chamber may be from 1 mm to 10 mm long (e.g. as measured from the bottom of the vapor chamber to a lowest end of the connector such as the free end of the connector); or from 2 to 8 mm, or from 3 to 6 mm, such as 4 to 5 mm.

Herein, the largest dimension of the vapor chamber can be up to 250 mm, up to 200 mm, or up to 150 mm. The largest dimension can be a width or a length. The largest dimension of the vapor chamber can be at least 50 mm, 60 mm 70 mm, or 80 mm.

Herein, the electronic device can have a thickness of up to 7 mm, 8 mm, 9 mm, or 10 mm.

Herein, a material may be thermally conductive, for example, if the thermal conductivity is at least 100 W/mK. Herein, components may be directly thermally coupled, if the two elements are in contact with each other or in contact with each other except for TIM in between.

Herein, the circuit board can be a printed circuit board (PCB), such as a PCB with castellations at least one edge.

Herein, a thermal interface material may have a maximum thickness of 0.25 mm, 0.2 mm, or 0.15 mm.

Herein, the vapor chamber may have a dimension of up to 200 mm along one direction, and up to 80 mm along another perpendicular direction. The vapor chamber thickness can be up to 6 mm, up to 5 mm, up to 4 mm, up to 3 mm, or up to 2 mm.

Herein the connectors described as being extending from a bottom of the vapor chamber may be, in an alternative, connectors which extend downward such that ends of the connectors are below the bottom of the vapor chamber.

Herein, shielding foam can be additionally used between the circuit board and the vapor chamber. Shielding foam can reduce electromagnetic interference between the heat source and the environment, for example.

Herein, a vapor chamber may include a fluid therein.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A vapor chamber, comprising:
   a plurality of connectors configured to couple to a circuit board,
   wherein the plurality of connectors extends from a bottom of the vapor chamber,
   wherein the plurality of connectors is configured to fix the vapor chamber to the circuit board such that the bottom thermally couples to a heat source on the circuit board, and
   wherein the connectors include a removable catch which is configured such that, when removed, the catch releases the vapor chamber from the circuit board.

2. The vapor chamber of claim 1, wherein
   the vapor chamber is configured to electromagnetically shield the heat source.

3. The vapor chamber of claim 1, wherein
   the plurality of connectors includes a conductor for making electrical contact with the circuit board.

4. The vapor chamber of claim 1, wherein
   the plurality of connectors is configured to snap-fit to the circuit board.

5. The vapor chamber of claim 1, wherein
   the plurality of connectors is configured for making contact forces in directions in the plane of the circuit board, and for negligible contact forces in a direction perpendicular to the plane of the circuit board.

6. The vapor chamber of claim 1, wherein
   the plurality of connectors is configured to couple to edges, castellations, and/or holes of the circuit board.

7. The vapor chamber of any claim 1, wherein
   the connectors include a plurality of cantilevers, wherein a free end of each cantilever is configured to attach to the circuit board.

8. A vapor chamber comprising:
   a plurality of connectors configured to couple to a circuit board,
   wherein the plurality of connectors extends from a bottom of the vapor chamber,
   wherein the plurality of connectors is configured to fix the vapor chamber to the circuit board such that the bottom thermally couples to a heat source on the circuit board, and
   wherein the plurality of connectors include a first row of connectors opposite to a second row of connectors.

9. The vapor chamber of claim 8, wherein
   the first and second rows of the plurality of connectors are configured to attach, respectively, to opposite edges of the circuit board.

10. The vapor chamber of claim 9, wherein
    the plurality of connectors is configured to connect to a connector assembly of the circuit board.

11. A vapor chamber comprising:
    a plurality of connectors configured to couple to a circuit board,
        wherein the plurality of connectors extends from a bottom of the vapor chamber,
        wherein the plurality of connectors is configured to fix the vapor chamber to the circuit board such that the bottom thermally couples to a heat source on the circuit board, and
    a removable shim, configured such that:
        when the vapor chamber is attached to the circuit board, and
        the shim is removed,
        a spring is released such that a compressive force is applied between the vapor chamber and the circuit board.

* * * * *